United States Patent [19]

Furtek

[11] Patent Number: 4,918,440

[45] Date of Patent: Apr. 17, 1990

[54] PROGRAMMABLE LOGIC CELL AND ARRAY

[76] Inventor: Frederick C. Furtek, 32 Hamilton Rd., Apt. 206, Arlington, Mass. 02174

[21] Appl. No.: 928,527

[22] Filed: Nov. 7, 1986

[51] Int. Cl.[4] .......................... H04Q 1/16; G06F 7/38
[52] U.S. Cl. .......................... 340/825.83; 310/825.79; 307/465
[58] Field of Search ..................... 340/825.83, 825.79, 340/825.87, 707; 307/465, 440, 445, 219, 468; 357/45

[56] References Cited

U.S. PATENT DOCUMENTS

| Re. 31,287 | 6/1983 | Patil | 340/825.79 |
|---|---|---|---|
| 3,400,379 | 9/1968 | Harman | . |
| 3,446,990 | 5/1969 | Goldberg | . |
| 3,818,252 | 6/1974 | Chiba et al. | 307/303 |
| 3,818,452 | 6/1974 | Greer | 340/166 R |
| 4,034,356 | 12/1975 | Howley et al. | 340/173 R |
| 4,068,214 | 1/1978 | Patil | 340/166 R |
| 4,161,662 | 7/1979 | Malcolm et al. | 307/213 |
| 4,240,094 | 12/1980 | Mader | 357/45 |
| 4,293,783 | 10/1981 | Patil | 307/465 |
| 4,331,950 | 5/1982 | Barabas | 340/825.79 |
| 4,336,601 | 6/1982 | Tanaka | 364/900 |
| 4,414,547 | 11/1983 | Knapp et al. | 340/825.83 |
| 4,422,072 | 12/1983 | Cavlan | 340/825.87 |
| 4,451,895 | 5/1984 | Sliwkowski | 340/707 |
| 4,467,439 | 8/1984 | Rhodes | 340/825.87 |
| 4,600,846 | 7/1986 | Burrows | 307/445 |
| 4,611,236 | 9/1986 | Sato | 357/45 |
| 4,642,487 | 2/1987 | Carter | 307/465 |
| 4,700,187 | 10/1987 | Furtek | 340/825.83 |

FOREIGN PATENT DOCUMENTS 0094234 11/1983 European Pat. Off. .
0204034 12/1986 European Pat. Off. .

OTHER PUBLICATIONS

S. Patil and T. Welch, "A Programmable Logic Approach for VLSI", IEEE Trans. on Computers, vol. C-28, No. 9, Sep. 1979, pp. 594-601.

Xilinx and Hamilton/Avnet Present Logic Cell Array TM: The User Programmable Gate Arrays, Xilinx, Inc.

L. Snyder, "Introduction to the Configurable, Highly Parallel Computer", IEEE Computer, Jan. 1982, pp. 47-55.

S. Patil, "A Micro-Modular Implementation of the Control Modules of Basic Macro-modular Circuits", M.I.T. Comp. Str. Group Memo 43, Oct. 1969.

M. Stucki, "Synthesis of Level Sequential Circuits", Computer Systems Lab, Washington University, (date not available).

J. Dennis and S. Patil, "Speed Independent Asynchronous Circuits", M.I.T. Comput. Str. Group Memo No. 54, Jan. 1971.

(List continued on next page.)

Primary Examiner—Robert L. Griffin
Assistant Examiner—Ralph E. Smith

[57] ABSTRACT

Programmable logic cells, and arrays of those cells, having certain characteristics, including: (1) the ability to program each cell to act either as a logic element or as a logical identity element(s) between one or more inputs and one or more outputs; (2) the ability to rotate circuits by 90° and to reflect circuits about horizontal and vertical axes; (3) an integrated logic and communication structure which emphasizes strictly local communications; (4) a minimal complexity of logic functions available at the cell level, making available a very fine-grained logic structure; and (5) suitability for implementation of both synchronous and asynchronous logic, including speed-independent circuits. Cells are arranged in a grid, with each cell communicating with its north, east, west and south neighbors. The cells are programmable to several states. Using a graphics-based programming environment, the user may construct systems at a pictorial block diagram level, rather than having to be concerned about the detailed implementation of the internal structure of each block. Blocks may be rotated and they may be reflected about horizontal and vertical axes, to place their input and output connections on different sides and positions without altering the internal electrical operation of the blocks.

22 Claims, 26 Drawing Sheets

OTHER PUBLICATIONS

S. Patil and J. Dennis, "The Description and Realization of Digital Systems", M.I.T. Comput. Str. Group Memo No. 71, Oct. 1972.

S. Patil, "Circuit Implementation of Petri Nets", M.I.T. Comput. Str. Group Memo No. 73, Dec. 1972. J J. Jump, "Asynchronous Control Arrays", *IEEE Trans. on Computers*, vol. C-23, No. 10, Oct. 1974, pp. 1020-1029.

S. Patil, "Cellular Arrays for Asynchronous Control", M.I.T. Comput. Str. Group Memo No. 122, Apr. 1975.

D. Misunas, "Petri Nets and Speed Independent Design", *Comm. of the ACM*, vol. 16, No. 8, Aug. 1973, pp. 474-481.

T. Agerwala, "Putting Petri Nets to Work", *IEEE Computer*, Dec. 1979, pp. 85-94.

C. Seitz, "Concurrent VLSI Architectures", *IEEE Trans. on Computers*, vol. C-33, No. 12, Dec. 1984 at pp. 1247-1265.

L. Snyder, "Parallel Programming and the Poker Programming Environment", *IEEE Computer*, Jul. 1984, pp. 27-33.

"Storage/Logic Arrays Finally Get Practical", *Electronics*, Jan. 20, 1986, at pp. 29-33.

P. Israelson et al., "Comparison of the Path Programmable Logic Design Methodology . . . ", Proc. IEEE Int'l. Conf. on Computer Design, Oct. 10, 1985, pp. 73-76.

"Logic Designers Toss Out the Clock", *Electronics*, Dec. 9, 1985, pp. 42-45.

R. Collett, "Programmable Logic Soars Into New Dimensions", *Digital Design*, Apr. 1985, pp. 42-54.

D. Wills, "Ultra-Fine Grain Processing Architectures", M.I.T. VLSI Memo No. 85-245, May, 1985.

E. Pacas-Skewes, "A Design Methodology for Digital Systems Using Petri Nets", PhD Diss., U. of Texas at Austin, 1979.

Kukreja et al.: "Combinational and Sequential Cellular Structures", IEEE *Transactions on Computers*, V.C-22, No. 9, 9/83, pp. 813-823.

F. B. Manning: "An Approach to Highly Integrated, Computer-Maintained Cellular Arrays", *IEEE Transactions on Computers*, vol. C-26, No. 6, 6/77, pp. 536-552.

Krug et al.: "Abaenderbare Gatter-Anordnungen", *Elektronik*, vol. 35, No. 22, 10/86, pp. 170-171, 174-176.

P. King: "Subcircuits on Linear Arrays-A New Array Topology", *IEEE Proceedings of the IEEE* 1985 *Custom Integrated Circuits Conference*, 5/85, pp. 470-474.

R. F. Hartmann: "CMOS Erasable Programmable Logic Devices TTL Replacement Made Easy", *Electro and Mini-Micro Northeast Conference Record*, 4/85, pp. 1-9.

Karatsu et al.: "An Integrated Design Automation System for VLSI Circuits", *IEEE Design & Test of Computers*, vol. 2, No. 5, 10/85, pp. 17-26.

| FIG. NO. OF STATE | x | y |
|---|---|---|
| 2A | 1 | 1 |
| 2B | 0 | 1 |
| 2C | 0 | 0 |
| 2D | 1 | 0 |

| FIG. NO. OF STATE | x | y |
|---|---|---|
| 6A | 1 | 1 |
| 6B | 0 | 1 |
| 6C | 0 | 0 |
| 6D | 1 | 0 |

| FIG. NO. OF STATE | x | y |
|---|---|---|
| 7A | 1 | 1 |
| 7B | 0 | 1 |
| 7C | 0 | 0 |
| 7D | 1 | 0 |

| FIG. NO. OF STATE | x | y | z |
|---|---|---|---|
| 12 A | 1 | 1 | 1 |
| 12 B | 1 | 1 | 0 |
| 12 C | 0 | 0 | 0 |
| 12 D | 0 | 1 | 0 |
| 12 E | 1 | 0 | 0 |
| 12 F | 0 | 0 | 1 |
| 12 G | 0 | 0 | 1 |
| 12 H | 1 | 0 | 1 |
FIG. 14
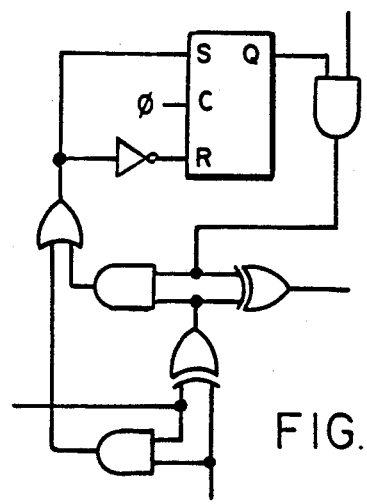
FIG.15A
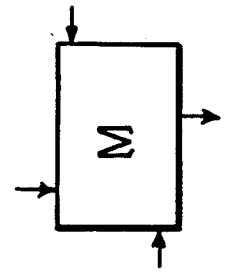
FIG. 15B
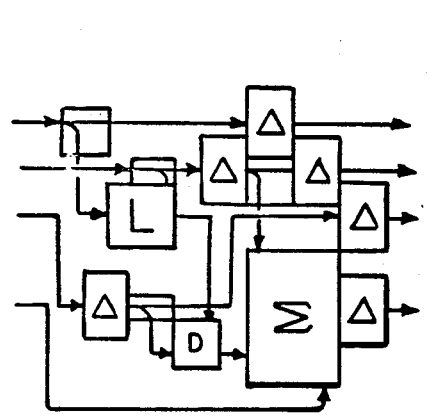
FIG. 15C
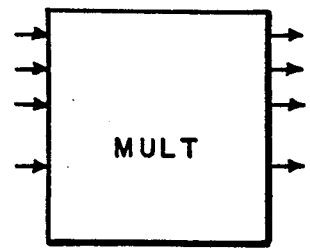
FIG. 15D

PROGRAMMABLE LOGIC CELL AND ARRAY

CROSS-REFERENCE TO RELATED APPLICATION

This application is related to my co-pending application, Ser. No. 803,536, now U.S. Pat. No. 4,700,187, titled "Programmable, Asynchronous Logic Cell and Array," assigned to the same assignee as the present invention. The disclosure of such application is hereby incorporated by reference, to avoid unnecessary repetition herein.

FIELD OF THE INVENTION

This invention relates to the field of digital logic circuits and, more particularly, to programmable and reprogrammable logic devices, and a graphics-oriented system for programming such devices.

BACKGROUND OF THE INVENTION

In the field of digital systems design, considerable efforts have been directed towards shortening product-development cycles. One of the significant factors in the length of such product development cycles is the time required for the design and fabrication of digital integrated circuits (IC's). Once a circuit design is completed, it generally takes at least four weeks, and often several months, to fabricate a silicon version of the circuit in a "chip." To reduce the design and fabrication interval, attempts have been made to provide various types of user-definable, or programmable, logic devices (PLD's). Prior PLD's include, inter alia, programmed logic arrays (PLA's) and gate arrays.

In the field of programmable logic, there are generally four strata of integrated-circuit customization available: (1) full custom IC's; (2) standard cell-based IC's; (3) mass-programmable IC's, such as gate arrays; and (4) user-programmable IC's, such as programmable logic devices. The first two alternatives involve customization of all mask layers required to manufacture the IC to the user's specifications and are therefore often referred to as "custom" IC design. The third alternative is sometimes called "semi-custom" IC implementation because only a few of the mask layers are customized to the users' specifications. The fourth alternative, user-programmable IC's, includes those IC's in which no customization of mask layers is required. The present invention falls into that latter category. The trade-offs between these various alternatives involve the time required to bring a new product design to market, engineering cost, expected unit volume, ease of use of design tools and familiarity with the design methodology.

Until recently, PLD's generally could be programmed only once, at the time of manufacture—they were generally not reprogrammable. Such programming has been accomplished by various methods. In PLA's, fusible-link bipolar technology has been employed, wherein such links are "blown" open to program these devices. In gate arrays, a custom metallization layer is deposited to interconnect the logic elements and provide the programming. Alternatively, a laser may be used to break connections in a metallization layer. The most significant limitation on these approaches is that the device can be programmed only once. For example, after an internal fuse has been blown, the device cannot be reprogrammed. Further, since fuses can only be blown once, bipolar PLD's can only be tested destructively. Such testing methods never allow for full evaluation, so most users of bipolar programmable logic devices have resorted to extensive post-programming testing specific to their applications. Additionally, a device which is only programmable one time (i.e., at the factory or in the field) must be discarded if a programming error is discovered or a change of program is desired.

Recently, a new genre of user-programmable IC's has been developed; these new IC's are electrically-programmable and reprogrammable logic devices, such as reprogrammable gate arrays and the device and system of my aforesaid patent application Ser. No. 803,536 (U.S. Pat. No. 4,700,187). To emphasize the reprogrammability of such components, they are sometimes called "erasable, programmable logic devices," or EPLD's. By contrast with earlier program-once technologies, an EPLD can be programmed more than once; therefore, an error in programming can be corrected by simply reprogramming the device. Another advantage of EPLD's is that they may be implemented in CMOS technology, rather than bipolar technology, since fuses are not required. This allows a substantial increase in logic density. Further, since the devices are reprogrammable, the entire device can be fully, nondestructively tested at the factory; such testing is independent of any device application and therefore need not be the user's responsibility.

In general, an EPLD comprises an array of logic elements and programmable means for interconnecting those elements. The choice of logic elements made available in the device, the interconnection mechanism and the logical and physical layout of components greatly influence the properties and capabilities of an EPLD. Consequently, EPLD's designed for one type of application may not be optimal for another type of application.

The most common earlier approaches in programmable logic devices, and a currently leading approach in EPLD's, employ variations of the PLA architecture, which is composed of an array of AND gates connected to an array of OR gates. Most PLD's add to these arrays input and output blocks containing registers, latches and feedback paths. The connections between the AND and OR arrays are programmable, as are the input and output blocks and feedback paths. Programmability of these connections is achieved through the use of fusible links, EPROM cells, EEPROM cells or static RAM cells.

Typical EPLD's are represented by the EPLD models 5C031, 5C032, 5C060, 5C090, 5C121, 5C180 and related devices of Intel Corporation, Santa Clara, Ca., described in the Intel publication titled *User Defined Logic Handbook*, EPLD Volume, 1986. Another good example of a programmable logic device is the Logic Cell Array (a trademark) from Xilinx, Inc. Both companies market EPLD's and associated development systems which provide tools to aid in the design of logic systems employing their respective programmable devices.

The Intel devices employ an architecture based on the "sum of products" PLA structure with a programmable AND-array feeding into a fixed OR-array. Design entry is accomplished by one of four methods: (1) schematic input of the logic circuit; (2) net list entry, by which the user enters the design by describing symbols and interconnections in words, following a standardized format; (3) state equation/diagram entry; and (4) Boolean equations. Intel's development system converts all design entry data into Boolean equations which are then converted to a sum-of-products format after logic reduction. The configurable logic block used in the Xilinx product is programmed either by the entry of Boolean equations or by the entry of a Karnaugh map.

While these EPLD architectures may represent an advance over prior logic systems which did not provide user programmability, they are far from ideal. The requirement that Karnaugh maps and Boolean equations be used to program these devices means the user must have extensive training in digital logic design. This, of course, limits the user base. Further, these approaches do not allow the designer to easily lay out circuits on a chip or see how efficiently or inefficently an arrangement of circuit modules utilizes a chip. Neither does either approach provide a tool for the modular, hierarchical design of complex circuits. Other deficiencies will be apparent to those skilled in the art.

Accordingly, it is an object of the present invention to provide a reprogrammable digital logic device which can be programmed easily to implement a large class of digital circuits.

Another object is to provide such a device which is electrically reprogrammable.

It is a further object of the invention to provide a programmable, universal digital logic cell or set of cells which can be employed to implement a large class of digital circuits.

Yet another object of the invention is to provide a computational apparatus and architecture in which concurrency can be extended to a very low level of granularity.

Another object of the invention is to provide a reprogrammable digital logic device which can be programmed and reprogrammed easily to realize a large class of Petri nets.

Another object of the invention is to provide a reprogrammable digital logic device which can be programmed and reprogrammed easily to implement self-timed logic systems.

Still another object of the invention is to provide a method, based upon graphics operations, to facilitate the programming of individual EPLD's as well as systems built up from a plurality of similar EPLD's.

A still further object of the invention is to provide a programmable logic device and a graphical programming environment therefor, which together support the modular, hierarchical construction of logic circuitry by means of block diagrams.

Yet another object of the invention is to provide a programmable logic device and a development system therefor, which support the translation, rotation and reflection of logic circuits and circuit blocks in designing a system on one or more of such devices.

SUMMARY OF THE INVENTION

These objects are achieved in the present invention by the use of particular programmable logic cells, and arrays of those cells, having certain characteristics. These characteristics include, inter alia, the following: (1) the ability to program each cell to act either as a logic element or as one or more logical "wire" elements (i.e., identity functions between one or more specified inputs and one or more specified outputs of the cell— these identity functions including crossovers, connections, right-angle bends, fan-outs, and routings running both horizontally and vertically); (2) the ability to rotate circuits (through 90° increments) and to reflect circuits about horizontal and vertical axes; (3) an integrated logic and communication structure which emphasizes strictly local communications; (4) a simple structure at the cell level, thereby making available a very fine-grained logic structure; and (5) suitability for implementation of both synchronous and asynchronous logic, including speed-independent circuits. Each cell preferably has two inputs and two outputs, allowing the cells to be arranged in a grid such that each cell communicates with its north, east, south and west neighbors. The cells are programmable to several states to provide the foregoing characteristics.

Such arrays of cells are well-suited to implementation in an integrated circuit "chip" using modern, very-large-scale integration (VLSI). On a chip, the logical wiring capabilities of the cells make it possible to "wire around" defective cells and elements. Thus, the invention shows promise for so-called "wafer-scale" integration or fabrication. If a large wafer contains a few defective cells, those cells can simply be avoided and bypassed, with the remainder of the wafer remaining useful. This may permit the fabrication of much larger chips than has heretofore been possible, since defects normally render a chip useless.

These chips can themselves be assembled into arrays and other configurations. Generically, an array of cells provided by the invention (whether disposed on one or more chips) may be referred to as a "medium," for reasons which will become apparent. For contrast and clarity of expression, an array of chips will be referred to hereinafter as a "matrix," to distinguish from an array of cells. A matrix of chips can be extended freely in any dimension desired. Thus, computing power can be increased by simply adding more chips to the matrix.

The basic logic cell is programmable and reprogrammable in accordance with existing technology adaptable to that purpose. Programming is accomplished by setting the states of an appropriate number of storage (i.e., memory) elements associated with each cell. In a first exemplary embodiment, the cells may be composed entirely of NOR gates, transistor switches and gain elements for driving adjacent cells. The gain elements may be inverters or tri-state devices; the latter may also provide the switching functions.

A reduction in cell complexity and increase in cell speed may be achieved by composing the medium from two types of cells which alternate with each other. The two types of cells may differ from each other only in that inverters are added on the inputs of the cells of a first type and on the outputs of the cells of the second (i.e., other) type. The inverters, though not providing logical function, cannot be eliminated, since they provide needed gain for logical wires. Since these inverters occur in pairs, their addition does not alter the logical operation of the array; indeed, as far as the user is concerned, the inverters may be ignored and the array may be dealt with as if it contained only one kind of cell.

The invention provides a general-purpose architecture for computation and digital systems. It is adaptable and readily usable for both synchronous and asynchronous operation, including speed-independent designs. Using an exemplary graphical programming environment, the individual logic cells may be programmed and connected together to implement an extensive class of logic circuits. Great flexibility is therefore achieved. Further, different cells on the same chip may operate concurrently and even independently of each other.

Configurations for (i.e., programs for setting cell storage elements to create) circuit blocks such as adders, multiplexers, buffer stacks, and so forth, may be stored in a library for future reference. With an adequate library, custom hardware can be designed by simply mapping stored blocks onto selected portions of chips and connecting the blocks together. This generates a tremendous savings in the time required for the development of many types of application-specific integrated circuits (ASIC's). Moreover, this approach allows the designer to construct systems at a pictorial block-diagram level, rather than at the circuit or detailed logic level. Further, blocks retrieved from the library may be moved, rotated, or reflected about a horizontal or vertical axis, to place their input and output connections on different sides and positions without altering the internal electrical operation of the block. This capability allows the user to construct systems at a pictorial block-diagram level without having to be concerned about the internal structure of each block. Further, it enhances the designer's freedom in laying out a chip design and reduces the size of the block-function library needed in any particular situation.

The invention is pointed out with particularity in the appended claims. The above and further objects, features and advantages of the invention may be better understood by referring to the following detailed description, which should be read in conjunction with the accompanying drawing.

BRIEF DESCRIPTION OF THE DRAWING

FIG. 14 is a table listing the correspondences between the three control bits x, y and z and the states of FIGS. 12A-12H which they select when applied to the circuitry of FIG. 13;

FIGS. 15A-15D are diagrammatic illustrations showing the progression from a conventional logic diagram (FIG. 15A) to block subsuming that circuit (FIG. 15B), to the incorporation of that block along with other blocks into a high-level module (FIG. 15C) to the display of that high-level module as a larger block (FIG. 15D);

DETAILED DESCRIPTION OF THE ILLUSTRATIVE EMBODIMENTS

A First Embodiment

Figure 1:
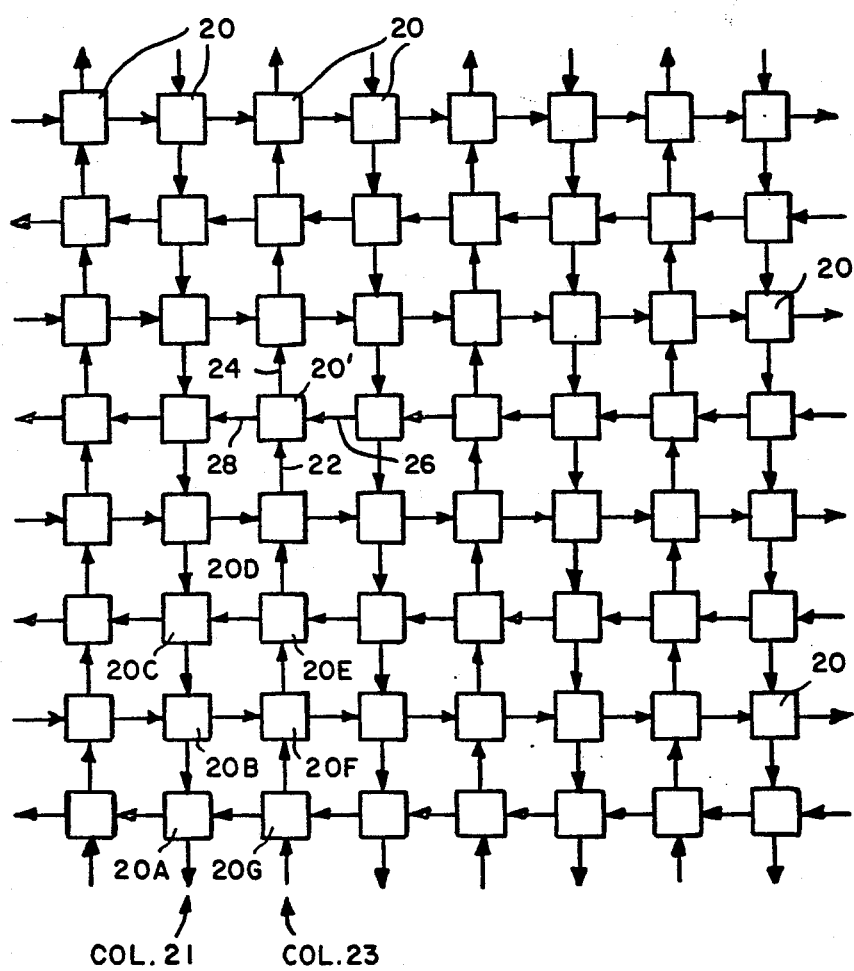
FIG. 1 is a diagrammatic illustration of an exemplary portion of an array of cells according to the present invention.

With reference now to FIG. 1, an array 10 of identical cells 20 (only a few of which are labelled) represents a segment of medium according to a first embodiment of the present invention. Each cell has two input connections and two output connections. One input connection (e.g., input connection 22 of cell 20') links the cell to its northern or southern neighbor; one output connection (e.g., 24) links the cell to the other of its northern and southern neighbors. The second input connection (e.g., 26) links the cell to its eastern or western neighbor and the second of the cell's output connections (e.g., 28) links the cell to the other of its eastern and western neighbors.

As the foregoing statement implies, a cell may be disposed in one of four possible orientations; these orientations are displaced at ninety degree increments of rotation, though each cell has a fixed orientation and is not rotatable. In the array, cell orientations alternate along rows and columns. The pattern is shown in FIG. 1. Looking at the second-from-left column of the array, 21, each cell receives one input from its northern neighbor and supplies one output to its southern neighbor; successive cells in the column are mirror images about a vertical axis, however (i.e., they are "flipped" horizontally relative to each other). Thus, each of cells 20A and 20C receives an input from its eastern neighbor and supplies an output to its western neighbor, whereas the converse applies to cells 20B and 20D. In the next column, 23, the cells maintain the same east-west input-output orientations as their neighbors in the second column, 21, while their north-south input-output connections are reversed with respect to the second column. That is, each cell in the third column (e.g., cells 20E, 20F and 20G) receives a first input from its southern neighbor and supplies a first output to its northern neighbor. This produces the four cell orientations represented by cells 20A, 20B, 20F and 20G.

Figure 2A:
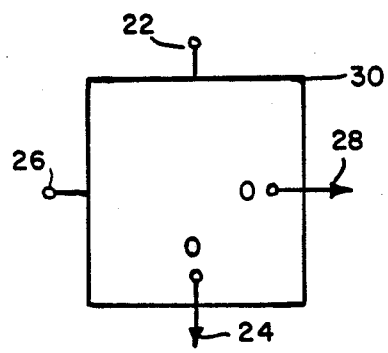
FIGS. 2A-2D are diagrammatic illustrations of a possible set of states for the cells of FIG. 1.
Figure 2B:
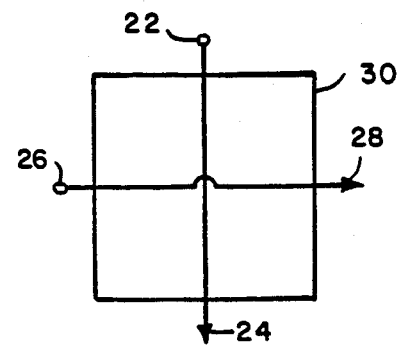
Figure 2C:
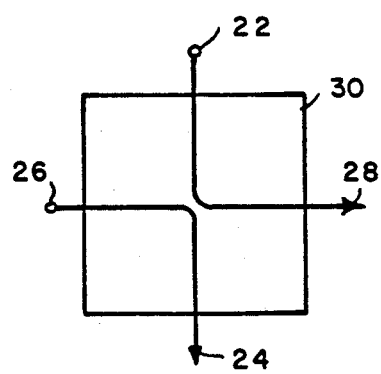
Figure 2D:
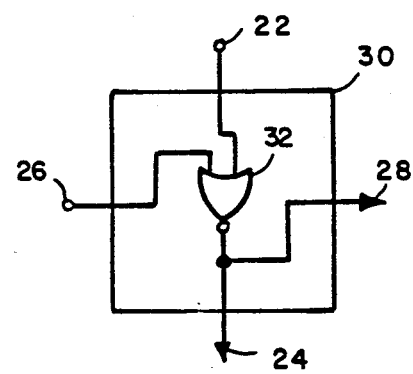

Each of cells 20 can be programmed to assume (at any appropriate time) one of a number of different states, or functions. To avoid unnecessary distraction from the explanation of the invention, the cell state memory is not illustrated, though it will be understood to be present. FIGS. 2A-2D show a minimal set of states in which a cell 30 may be placed; additional states may be provided at the designer's discretion. In the first state, illustrated in FIG. 2A, the output connections 24 and 28 of the cell are both connected to a logical zero source. The input connections 22 and 26 are not operatively connected to either output. In the second state, illustrated in FIG. 2B, a "crossover" type of connection is implemented; that is, two identity operations are provided. Input connection 22 is logically connected to output lead 24 without transformation and input connection 26 is logically connected to output lead 28 without transformation; there is no coupling between those two connection-pairs. FIG. 2C depicts a double right-angle bend: input connection 22 directly feeds output connection 28 and input connection 26 directly feeds output connection 24; there is no coupling between those two connection-pairs. In a fourth state, such as the state shown in FIG. 2D, cell 20 implements a universal two-input logic element with a fan out of two; the universal logic element may be a NOR gate, such as the one illustrated at 32, or another element of choice.

Figures 3, 4:
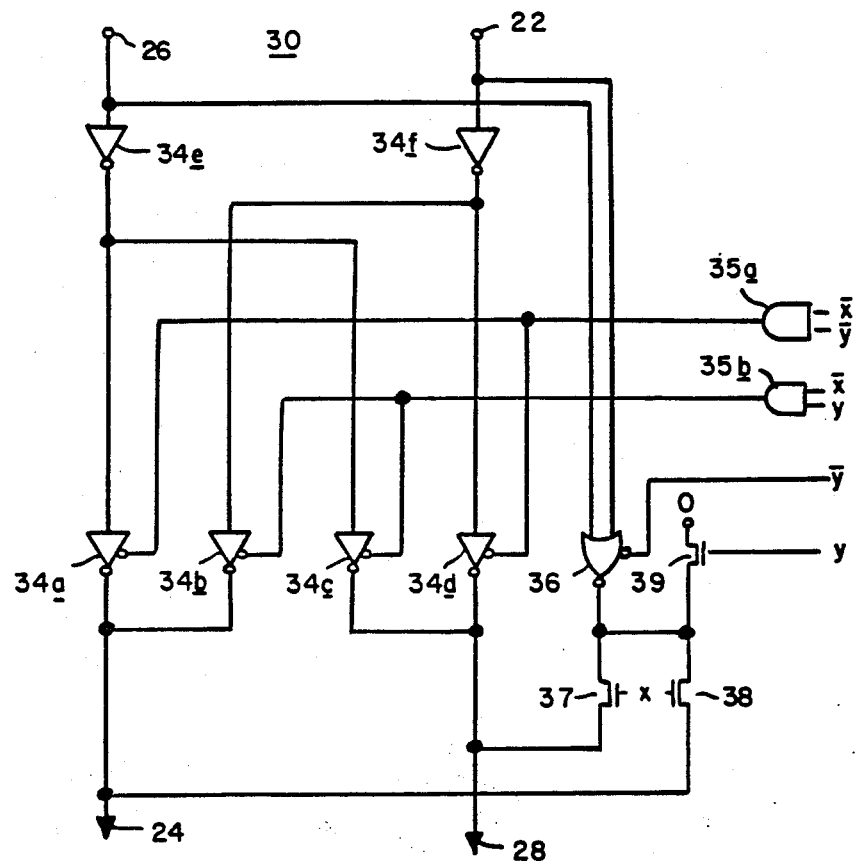
FIG. 3 is a schematic diagram for a circuit for implementing the four-state cell of FIGS. 2A-2D.
FIG. 4 is a table listing the values of the control bits x and y which when applied to the circuit of FIG. 3 will produce the states of FIGS. 2A-2D.

A schematic circuit for implementing the four-state cell 30 of FIGS. 2A-2D is shown in FIG. 3. The circuit comprises four tri-state inverters 34a-34d, two regular inverters 34e and 34f, two AND gates 35a and 35b, a tri-state NOR gate 36 and three transistor switches 37-39. The state of cell 30 is controlled (i.e., programmed) by two bits, labelled "x" and "y". FIG. 4 contains a self-explanatory table listing the state of cell 30 as a function of bits x and y; the tri-state inverters 34a-34d, the tri-state NOR gate 36, and the transistor switches 37, 38 and 39 are turned on (i.e., closed) when the applied control signal is high (i.e., a logical "1").

Figure 5:
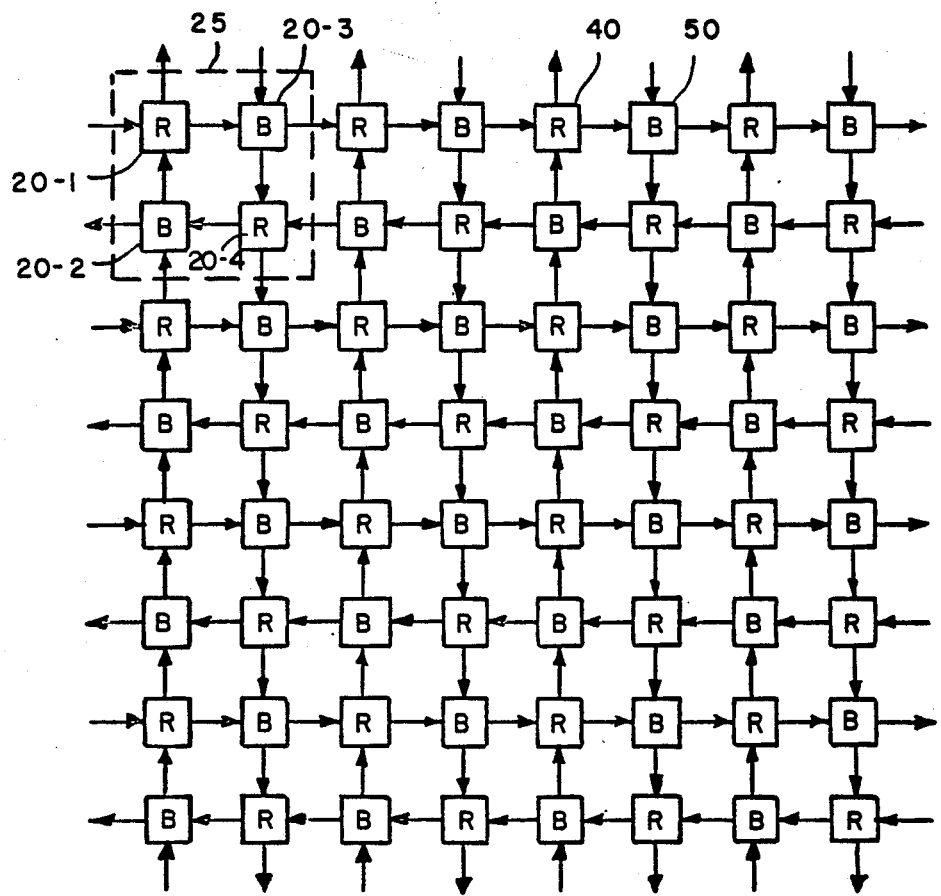
FIG. 5 is a diagrammatic illustration of an array of cells according to the present invention, utilizing two types of cells, referred to as "red" cells and "black" cells.
Figure 6A:
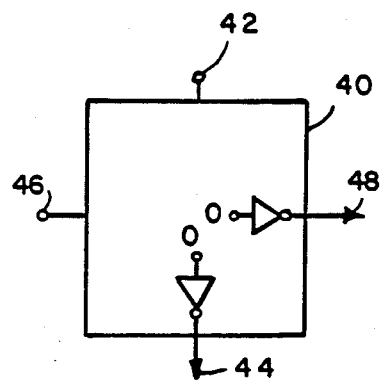
FIGS. 6A-6C are schematic illustrations of four possible states for the red cells of FIG. 5.
Figure 6B:
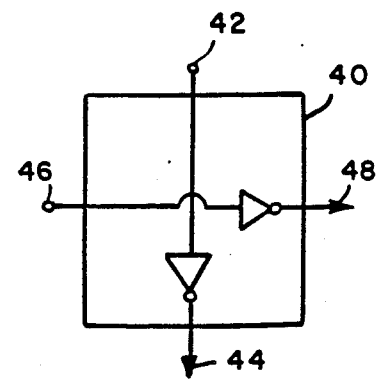
Figure 6C:
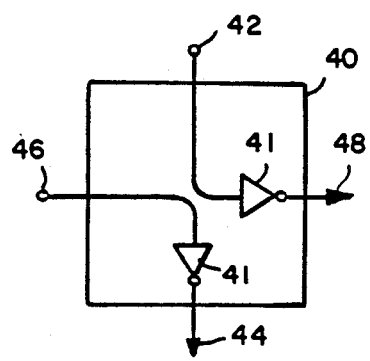
Figure 6D:
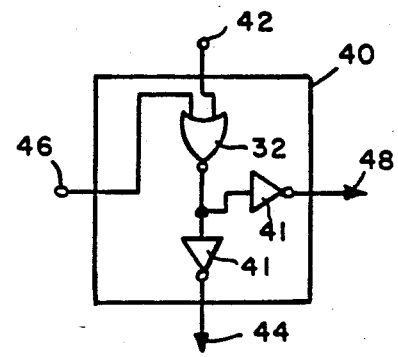
Figure 7A:
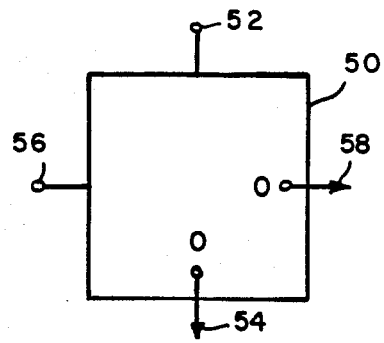
FIGS. 7A-7D are schematic illustrations of four possible states for the black cells of FIG. 5.
Figure 7B:
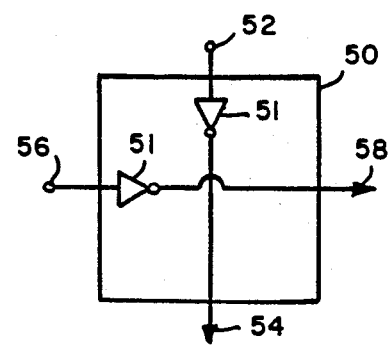
Figure 7C:
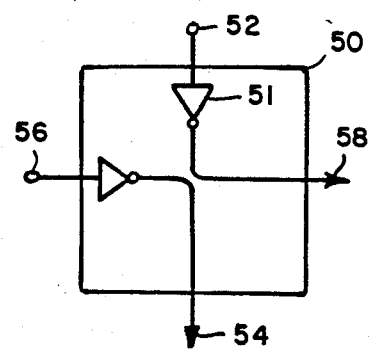
Figure 7D:
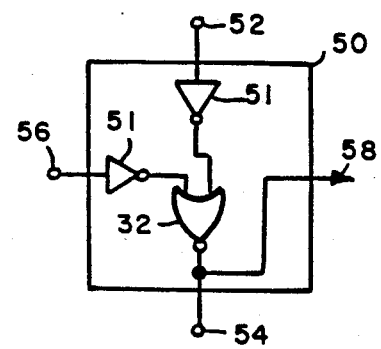

As previously stated, each cell should have appropriate gain elements between its input and output connections in order to ensure that logical wires function properly. Generally, pairs of inverters are used for this purpose. To reduce the number of inverters and thereby speed up the circuit, adjacent cells may employ opposite logic conventions on their inputs. That is, for a particular cell a high input may correspond to a logical "1", while for an adjacent cell a high input may correspond to a logical "0". For ease of reference these two types of cells may be referred to as "red" cells and "black" cells since they are arranged in the array similarly to the red and black squares of a checkerboard. FIG. 5 illustrates the resulting topology, with black cells 20-2 and 20-3 labelled "B" and red cells 20-1 and 20-4 labelled "R". FIGS. 6A-6D depict the four states of the "red" type of cell 40, while FIGS. 7A-7D depict the corresponding states of the "black" type of cell 50. The red cells and black cells differ from the basic cell 30 of FIGS. 2A-2D by the addition of two inverters in each active cell state; in the red cells 40, the inverters 41 are added in each output line of the cell, whereas in the black cells 50, the inverters 51 are added on each input line of the cell. When an inverter in the input circuit of a black cell is connected to an inverter in the output circuit of a red cell, the effects of the inverters cancel each other, leaving the circuit the equivalent of that which would be formed from the basic cell 30 of FIGS. 2A-2D. For this reason, the inverters have no effect on the logical operation of the array.

Figures 8, 9:
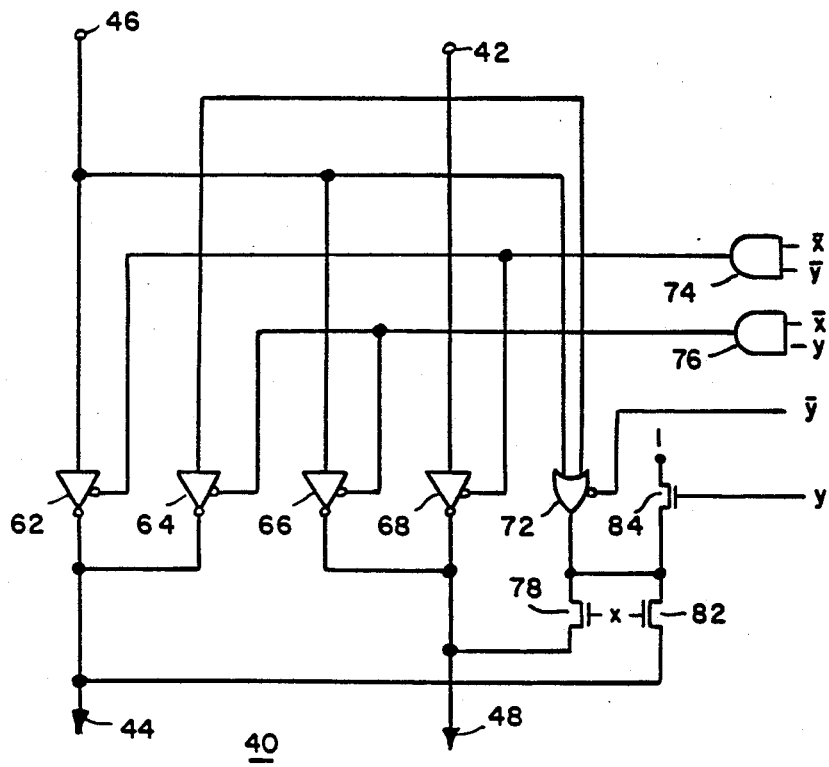
FIG. 8 is a schematic diagram for a circuit for implementing the red cells of FIGS. 5 and 6A-6D.
FIG. 9 is a table relating the control bits x and y to the appropriate state of FIGS. 6A-6D which they would select when applied to the circuit of FIG. 8.
Figures 10, 11:
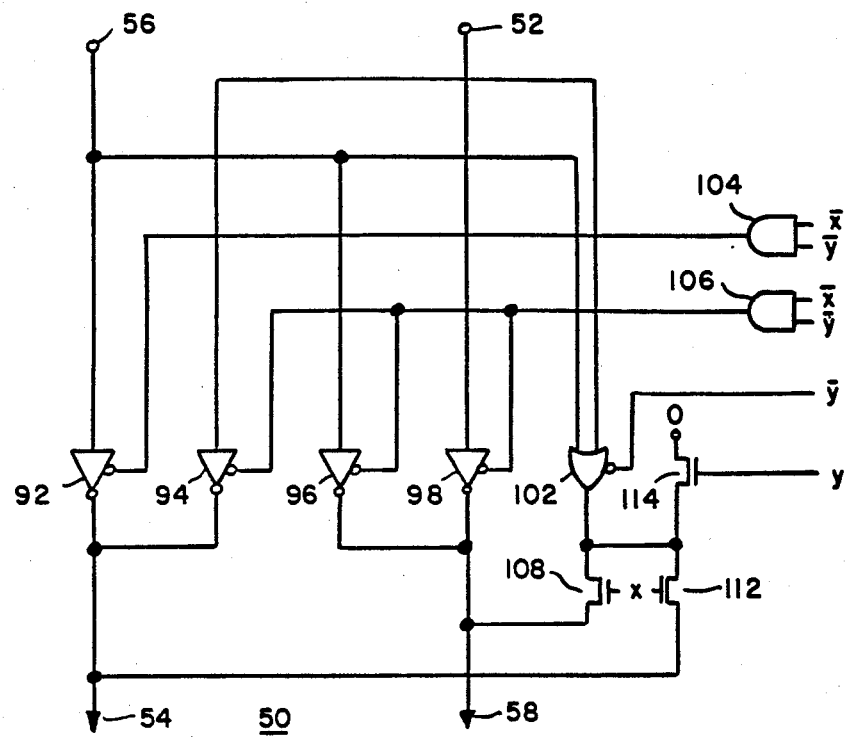
FIG. 10 is a schematic diagram for a circuit for implementing the black cells of FIGS. 5 and 7A-7D.
FIG. 11 is a table listing the correspondences between the control bits x and y and the states they would produce in FIGS. 7A-7D when applied to the circuit of FIG. 10.

Schematic circuit diagrams for red and black cells 40 and 50, respectively, are contained in FIGS. 8 and 10. With reference to FIG. 8, red cell 40 is formed from four tri-state inverters 62-68; a tri-state OR gate 72; a pair of AND gates 74 and 76; and three transistor switches 78, 82 and 84. The state of cell 40, like that of cell 30, is programmed by two bits, labelled "x" and "y". FIG. 9 contains a self-explanatory table listing the state of cell 40 as a function of x and y. Correspondingly, FIG. 10 shows how a black cell 50 may be created from four tri-state inverters 92-98; a tri-state AND gate 102; a pair of AND gates 104 and 106; and three transistor switches 108, 112 and 114. The state of cell 50 is also programmed by two bits, again labelled "x" and "y". FIG. 11 provides a table listing the state of cell 50 as a function of bits x and y.

Since the term "cell" is used extensively herein, it is important to appreciate that that term has somewhat arbitrary boundaries, as FIG. 5 demonstrates. Thus, blocks of four cells may be aggregated to form a regular structure having a single type of "macro-cell" building block. Thus, the group of cells 20-1, 20-2, 20-3 and 20-4 may be considered the basic element of the structure, as suggested by the dashed line 25 enclosing them. The macro-cell enclosed by line 25 has both an input connection and an output connection on each of its north, south, east and west sides; and it can be programmed to any of 256 states.

An array may also be built of cells of two distinct types, which provide different logic functions. This is to be contrasted with the use of red and black cells, which provide the same logic functions and differ only in their electrical implementations. However, even if two or more types of cells are employed, it is still possible to define a block, or macro-cell, such that the array may be described as being built from a single type of block connected to its north, east, west and south neighbors.

A Second Embodiment

Figures 12A, 12B, 12C:
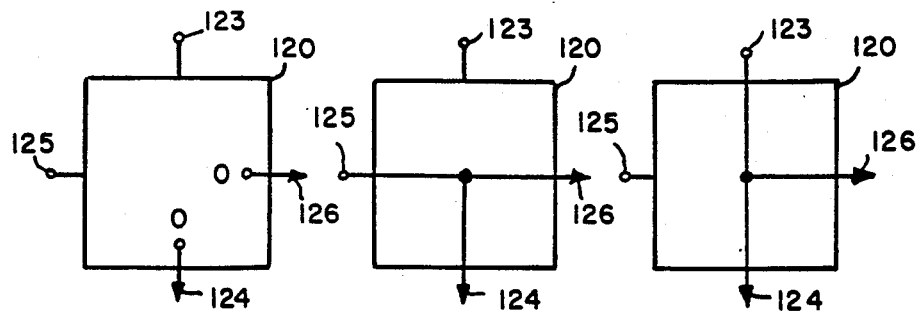
FIGS. 12A-12H are schematic circuit diagrams representing the possible states of an eight-state cell according to the present invention.
Figures 12D, 12E, 12F:
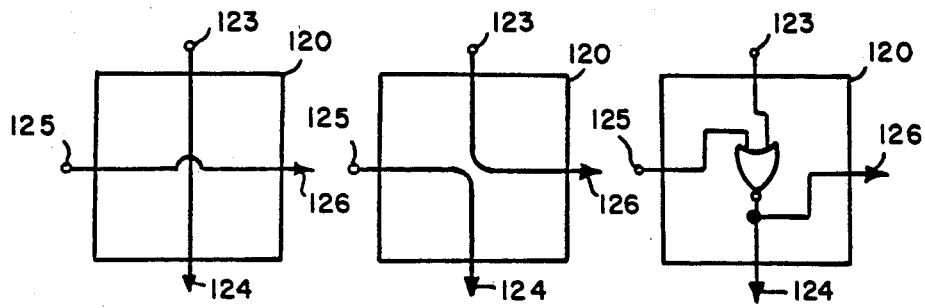
Figures 12G, 12H:
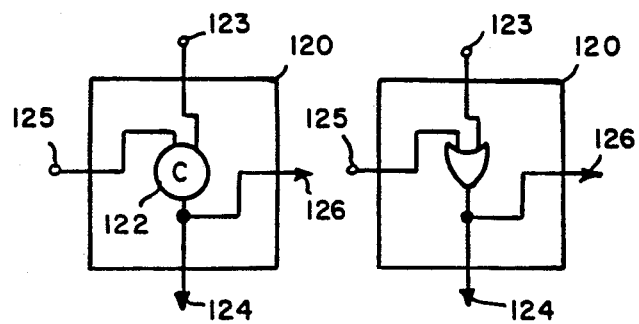

Cells which make available more than four states also may be employed. FIGS. 12A-12H depict one possible set of available states for an eight-state cell 120, which is programmed by three bits x, y and z. Other state combinations are, of course, possible. The cells inputs are received on leads 123 and 125; its outputs appear on leads 124 and 126. In FIG. 12G, the logic element 122 is a Muller C-element; this element is particularly useful in the implementation of speed-independent logic. The other states represented in FIGS. 12A-12F and 12H are self-explanatory, including outputs set to zero, inputs wired directly to outputs (for crossovers, right-angle bends and multiple fan-outs), and two-input OR and NOR gates. Other states which might be of interest include states containing flip-flops and more complex circuits; the C-element might be exchanged for a flip-flop, for example.

Figure 13:
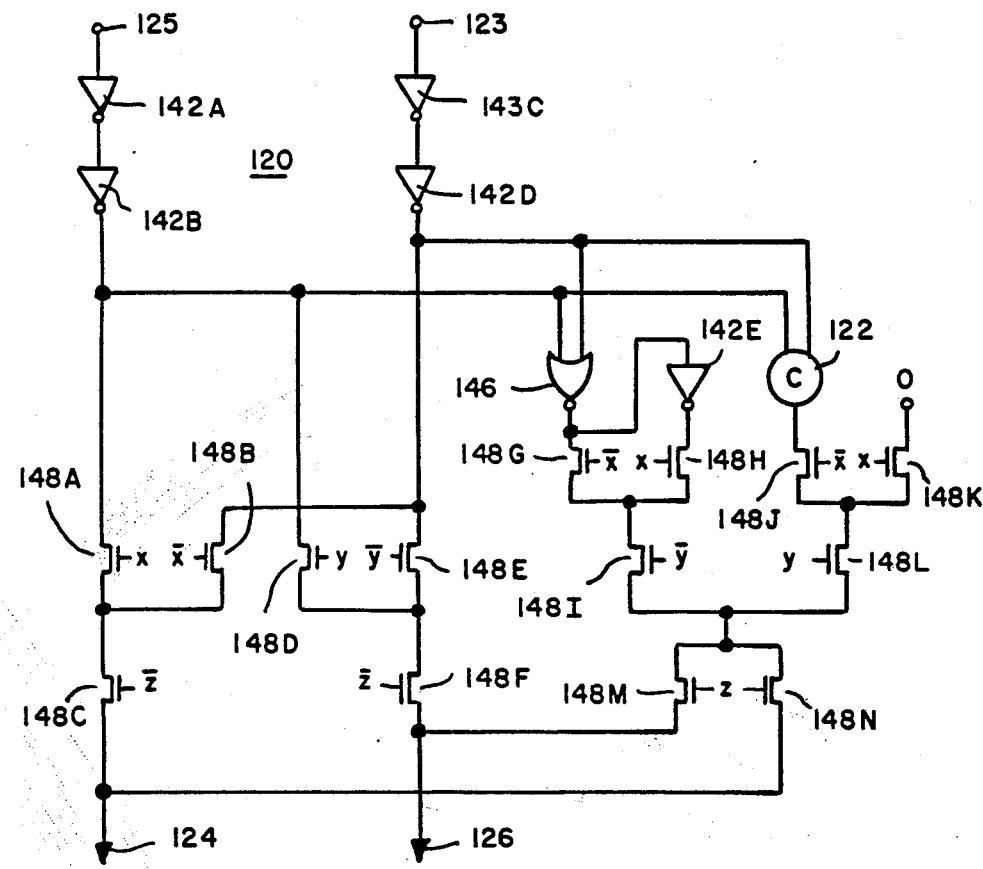
FIG. 13 is a schematic diagram of a circuit for implementing the eight-state cell of FIGS. 12A-12H.

A schematic circuit diagram for the cell 120 appears in FIG. 13. This cell has five inverters 142A-142E, a C-element 122, a NOR gate 146 and fourteen transistor switches labelled 148A-148N. The switches are programmable by three bits labelled x, y and z. FIG. 14 provides a table listing an exemplary mapping between bits x, y, and z and the various cell states.

The Programming System

In my prior patent application Ser. No. 803,536, I described the essentials of a graphical system for programming an earlier form of programmable logic cell and array which shares with the present invention the basic concept of a cellular arrangement of programmable logic units. That programming system is also useful in connection with the present invention and it has been enhanced to provide the system designer with even more powerful tools than were taught in the aforementioned patent application.

The programming system provides two design modes to the user: (1) a circuit mode for creating the lowest-level modules and (2) a block-diagram mode for creating higher-level modules. In the circuit mode, the user works directly with individual cells, determining which cells function as logical elements and determining how those elements are interconnected. In the block-diagram mode, the user does not deal directly with individual cells or logic elements but, rather, with blocks representing previously created modules. The size and location of each block reflects the actual size and location of the module in the array. Thus, a block diagram on the screen of the graphics programming terminal provides not only a functional definition of the composite module, but also the topological layout of the associated circuit.

In the block-diagram mode, the user is able to create and manipulate a complex circuit by recalling previously created modules, moving modules, flipping and rotating modules, duplicating modules, interconnecting modules, and deleting modules and interconnections. This ability to reorient modules (and, therefore, circuits) without changing their functionality facilitates the efficient interconnection of functional blocks. FIGS. 15A-15D illustrate the progression from a logic diagram (FIG. 15A) to a block representing the logic circuit (FIG. 15B) to a module incorporating that circuit (FIG. 15C), and thence to a higher level block representing that module (FIG. 15D). The techniques for transforming modules by translation, rotation and reflection (i.e., flipping) are developed below.

For purposes of the following discussion, it will be assumed (to simplify the presentation) that rectangular blocks are to be transformed. In general, though, a "block" or "module" is a region of the array, of arbitrary shape and size. A module and its "origin" are considered to be "located" at the position of its upper left corner cell (or the equivalent, for non-rectangular modules), as a convenient convention; other definitions can be used just as easily, with appropriate modification of the text which follows. Within a module, a cell is located at coordinates (i,j), where the cell in the upper left corner of the module is at coordinates (1,1); "i" increases from left to right and "j" increases from top to bottom.

Figure 16:
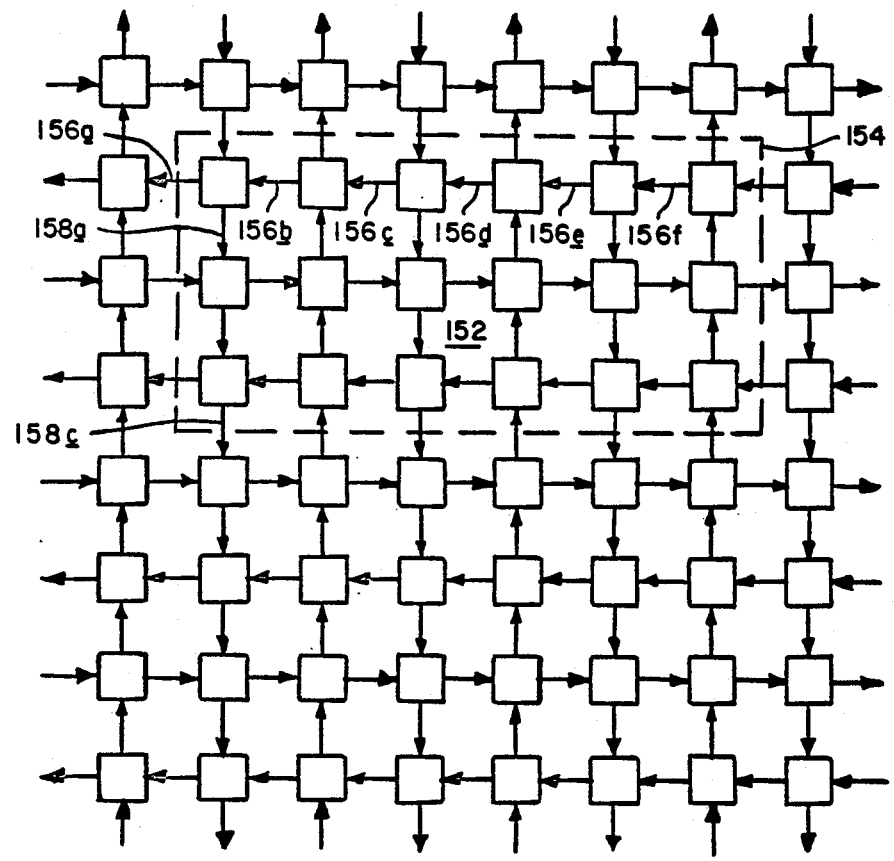
FIG. 16 is a diagrammatic illustration of an array of cells according to the present invention, showing a module formed by a group of cells therein.

Each module has a "vertical parity" and a "horizontal parity"; these parities identify the orientation of the inputs and outputs of the module's cells. Parity will best be understood by reference to FIG. 16. There, a module 152 appears within dashed line 154. A module's horizontal parity is determined by the direction of the horizontally-directed output of each cell in the top row of the module; with respect to module 152, refer to output/input leads 156a-156f. Horizontal parity is said to be "even" or "1" if the horizontally-directed output from each cell in the top row of the module is supplied to its eastern, or right hand, neighbor. Conversely, a module's horizontal parity is said to be "odd" or "0" if the horizontally-directed output from each cell in the top row of the module is supplied to the cell's western, or left-hand, neighbor. Vertical parity is treated in comparable fashion. A module's vertical parity is said to be "even" or "1" if the vertically-directed output from each cell in the leftmost column of the module is supplied (e.g., see leads 158a-158c) to the cell's southern, or lower, neighbor. Conversely, a module's vertical parity is said to be "odd" or "0" if the vertically-directed output of each cell in the leftmost column of the module is connected to its northern, or upper, neighbor.

A row or column may also be said to have parity, with the same definitions being applied; thus, the row or column may be thought of as a module which is only one cell high or one cell wide.

To ensure that the transformed module has the correct parities, an appropriate horizontal or vertical translation of the module may be required when a module is translated, rotated or reflected. Note that translation by an odd number of cells in the horizontal direction will cause a reversal of vertical parity and translation by an odd number of cells in the vertical direction will cause a reversal of horizontal parity. For a simple translation of a module, maintaining the correct parities in the transformed module is accomplished by restricting movement to an even number of cells in each direction. For reflection and rotation, the situation is somewhat more complicated and detailed procedures are given below.

Figure 17:
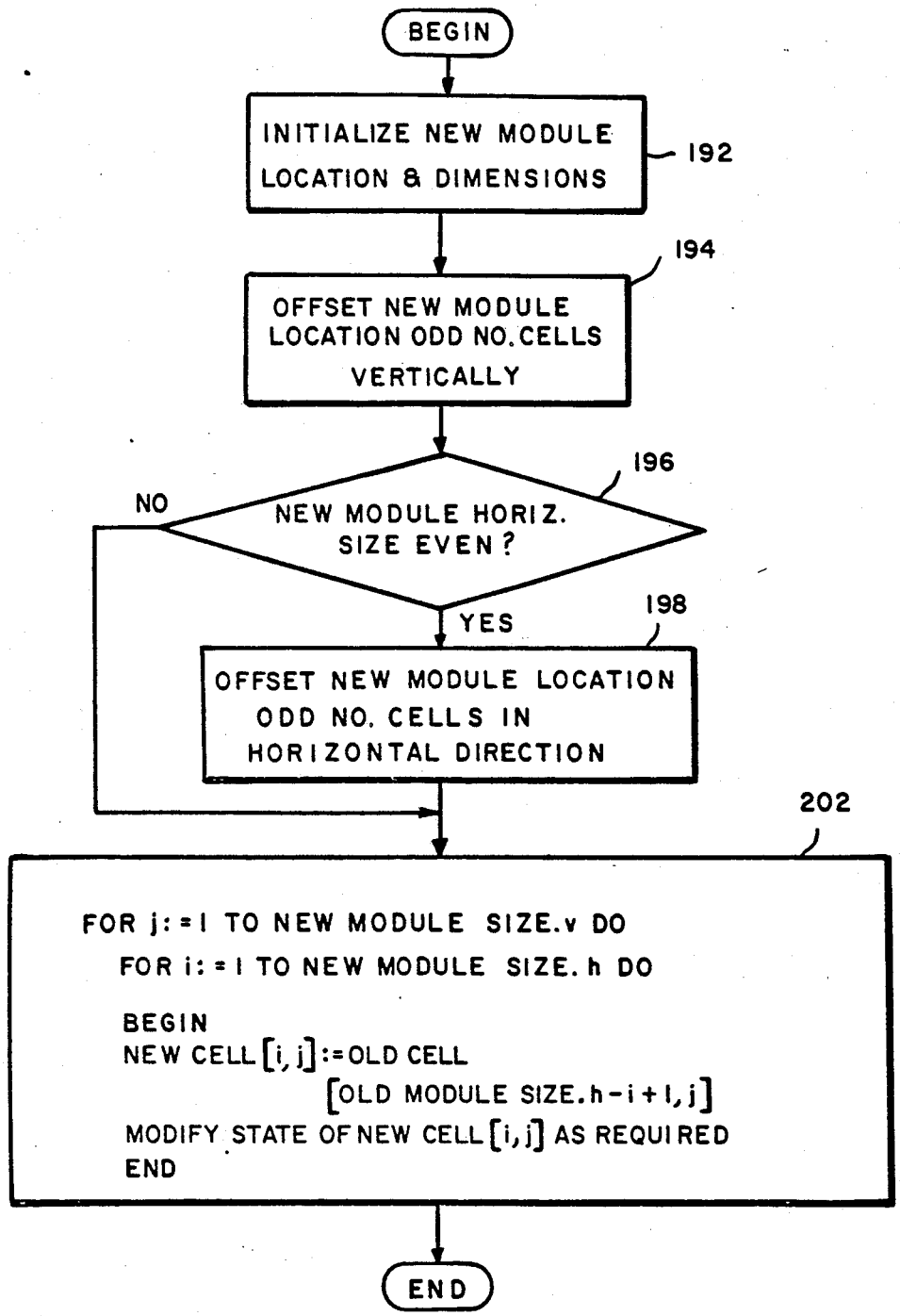
FIG. 17 is a flow chart showing the steps for reflecting a block of cells about a vertical axis.
Figure 18A:
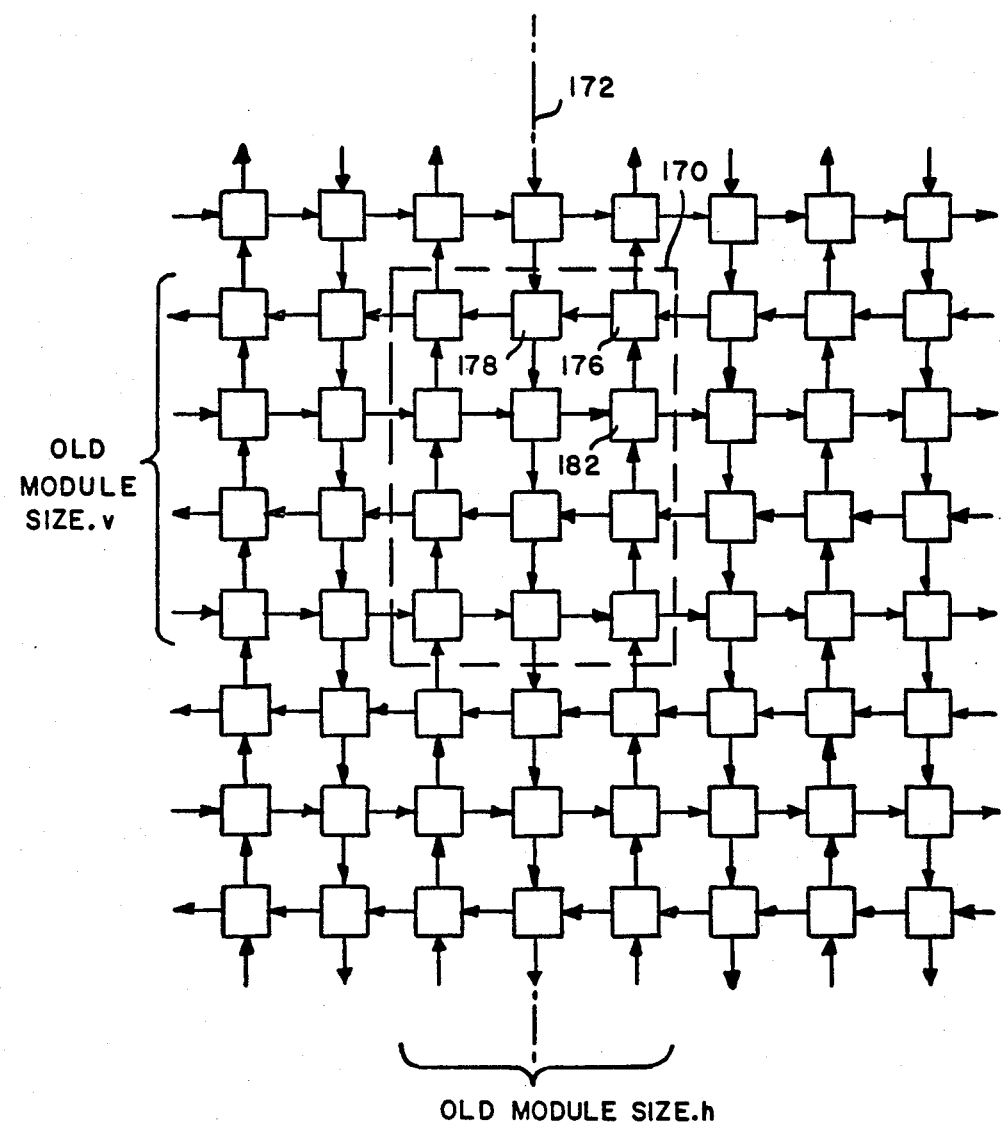
FIG. 18A shows a block in the array which is to be reflected about a vertical axis.
Figure 18B:
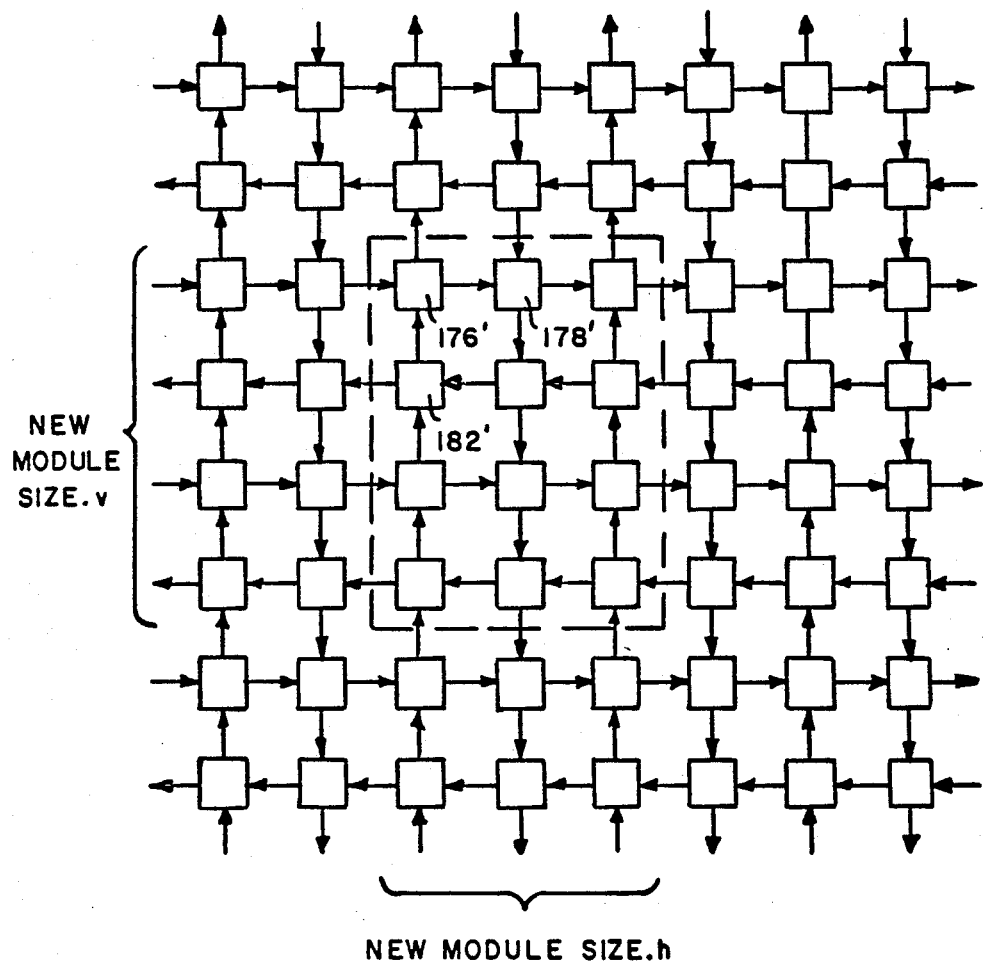
FIG. 18B shows the block of FIG. 18A after being reflected about a vertical axis in accordance with the steps of FIG. 17.

The steps for reflecting a block about a vertical axis are depicted in FIG. 17, which should be read in relation to FIGS. 18A and 18B. The module shown in the dashed lines 170 in FIG. 18A is to be reflected about its central vertical axis 172 (which bisects the module through its central column, since the module is an odd number of columns wide). Broadly speaking, reflection is accomplished by (1) establishing the position of the new, transformed module in accordance with parity requirements and (2) mapping the original cells onto the cells of the new module. In detail, the reflection proceeds as follows: First, the location and dimension of the new module (i.e., the module resulting from the transformation) are initially defined to be the same as those of the original (i.e., untransformed) module (Step 192). Second, the new module's location is offset (i.e., shifted) by an odd number of cells vertically, to provide the appropriate horizontal parity; typically, the offset will be one cell in either direction (Step 194). The module may also have to be shifted horizontally, to achieve proper vertical parity; such a shift is only required, however, if the new module spans an even number of cells in the horizontal direction. Such parity adjustment is necessary to ensure that the new module contains the correct circuit. If module parity is improper, the circuit will not only be reflected about the axis, but also it will be altered. The parity adjustment routine begins with a test to determine whether the horizontal size of the module is even, Step 196, and a horizontal shift is performed in Step 198 if required. Having properly situated the new module, each cell of the old module must be mapped into the space occupied by the new module. In Step 202, a Pascal-type expression is given for a procedure which accomplishes that operation. This procedure comprises a pair of nested loops. The outer loop is indexed by the variable "j", which denotes the vertical coordinate of a cell in the new, reflected module, relative to the module's origin (i.e., upper left hand corner). The horizontal size of the new module (i.e., after reflection), is represented by the variable newModuleSize.h. The inner loop is indexed by the variable "i", which denotes the horizontal coordinate of a cell in the new module, relative to the module's origin. The quantity "newCell[i,j]" represents the state, or function, of the cell at coordinates (i,j) in the new module; the quantity "oldCell[moduleSize.h-j+1,i]" represents the state of the cell in the original, "old" module at the indicated coordinates. The procedure of Step 202 first maps cell states of the old module into cell states of the new module and then makes adjustments in the new states, as required, to reflect its reorientation. Some cell states retain their identities through the transformation. The adjustments of states for the new cells can be performed through a look-up table or other mechanism. Once the new cell states are known, the corresponding bits in the cell state memory, which control the programming of those cells, are set to the appropriate values.

The transformed module 170' is shown in FIG. 18B, from which it will be appreciated that a vertical translation was needed in order to achieve proper parities. Cells 176, 178 and 182 have been mapped to cells 176', 178' and 182'.

Figure 19:
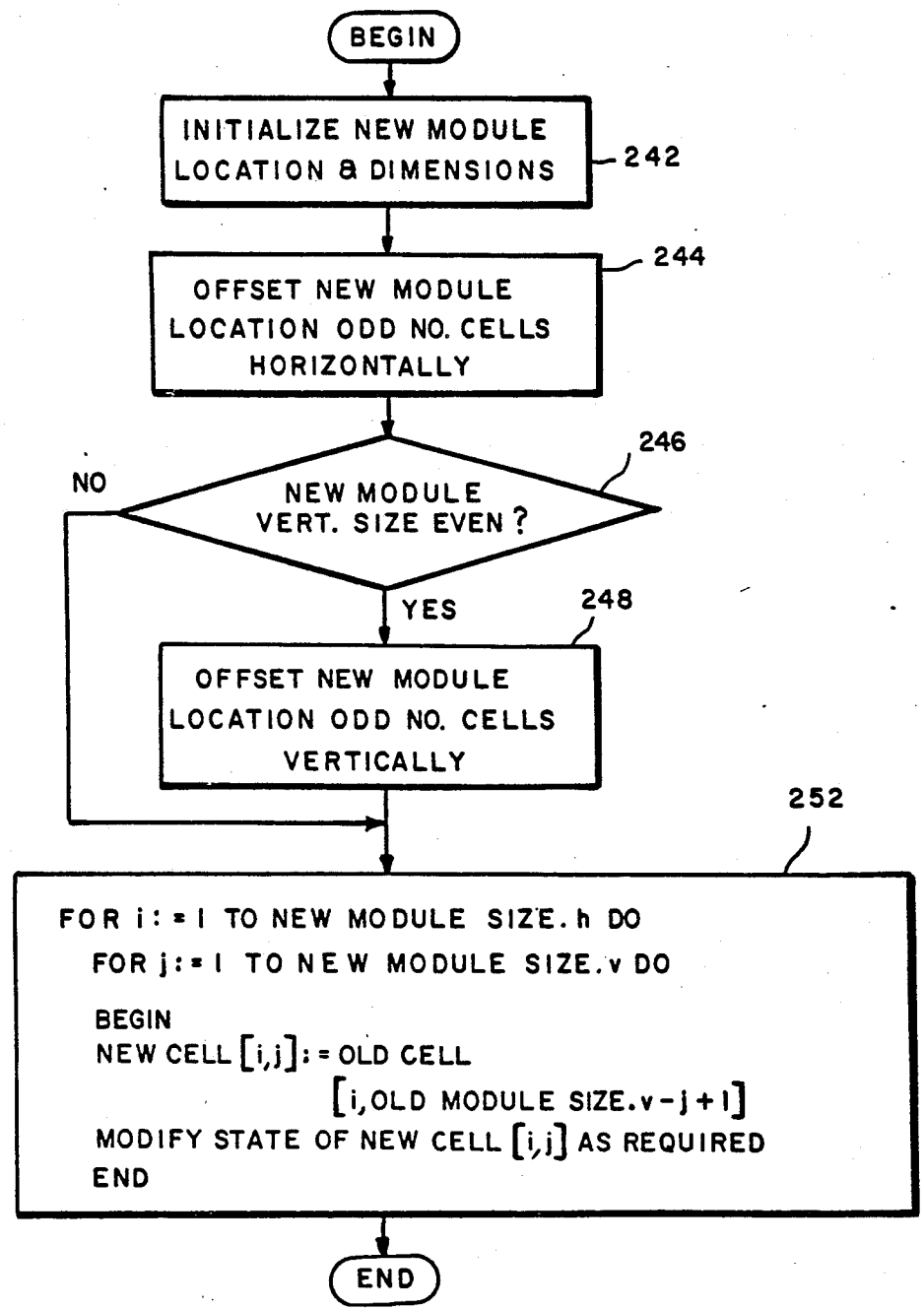
FIG. 19 shows a flow chart for the procedure for reflecting a block about a horizontal axis.
Figure 20A:
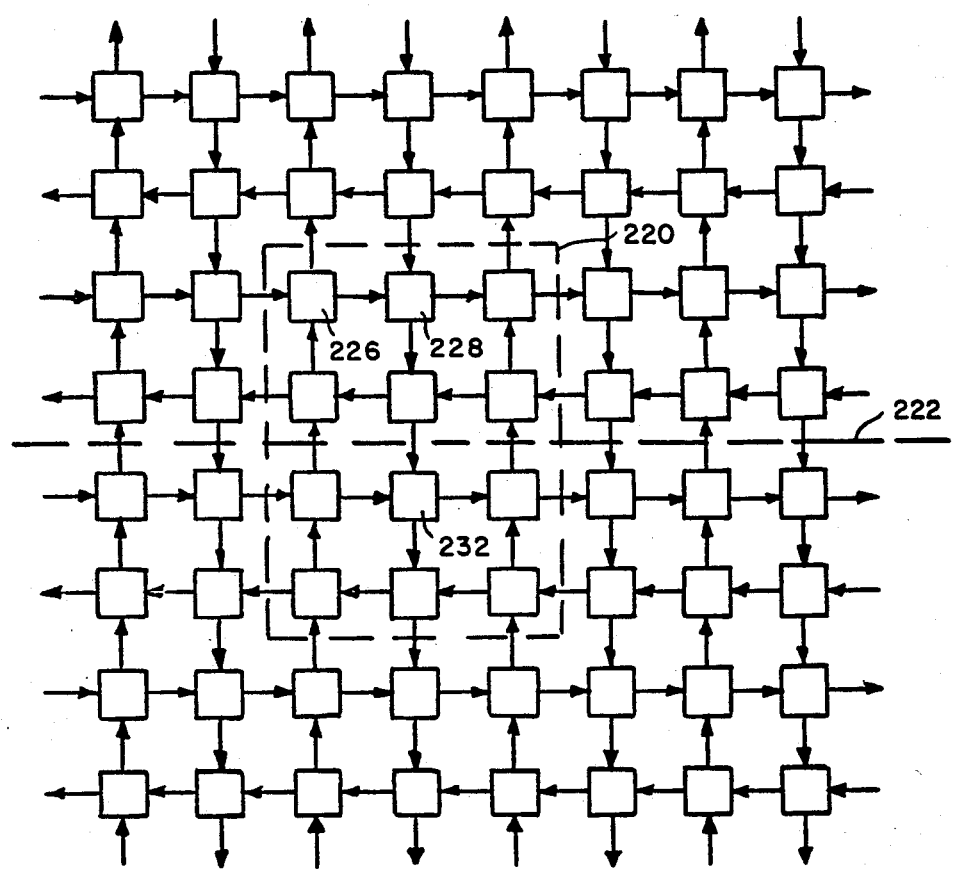
FIG. 20A shows a block of cells in the array which is to be reflected about a horizontal axis.
Figure 20B:
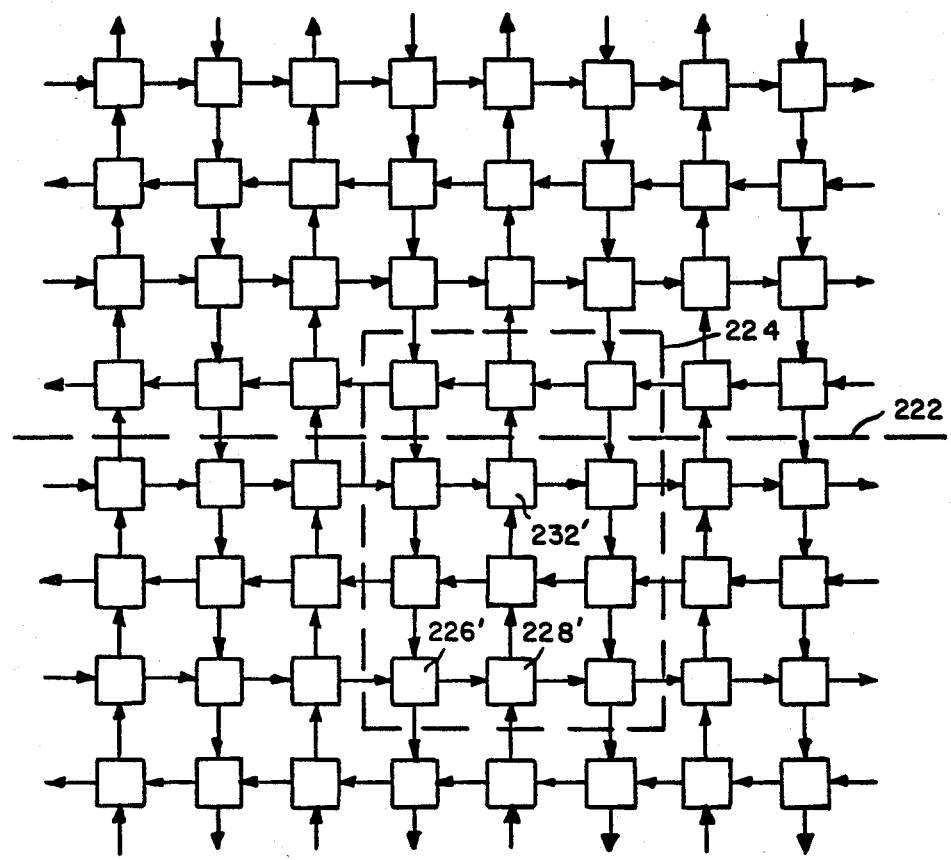
FIG. 20B shows the block of FIG. 20A after reflection about the horizontal axis 222.

The steps for reflecting a block about a horizontal axis are depicted in FIG. 19, which should be read in conjunction with FIGS. 20A and 20B. In FIG. 20A, a block originally shown at the position of dashed line 220 is to be reflected about horizontal axis 222. The reflection is performed as follows: First, the location and dimensions of the new module (i.e., the module resulting from the transformation) are initially defined to be the same as those of the original (i.e., untransformed) module (Step 242). Second, the new module's location is offset (i.e., shifted) by an odd number of cells horizontally, to provide the appropriate vertical parity; typically, the offset will be one cell in either direction (Step 244). The module may also have to be shifted vertically, to achieve proper horizontal parity; such a shift is only required, however, if the new module spans an even number of cells in the vertical direction. A test for this condition is performed in Step 246 and the vertical shift is performed in Step 248 if required. Having properly situated the new modules, each cell of the old module must be mapped into the space occupied by the new module. The procedure for doing so is performed at Step 252 and mirrors the procedure in Step 202 of FIG. 17 for the reflection about a vertical axis.

The transformed module 224 is shown in FIG. 20B, with cells 226, 228, and 232 mapped onto cells 226', 228' and 232', respectively. Note that both vertical and horizontal shifting was required.

Figure 21:
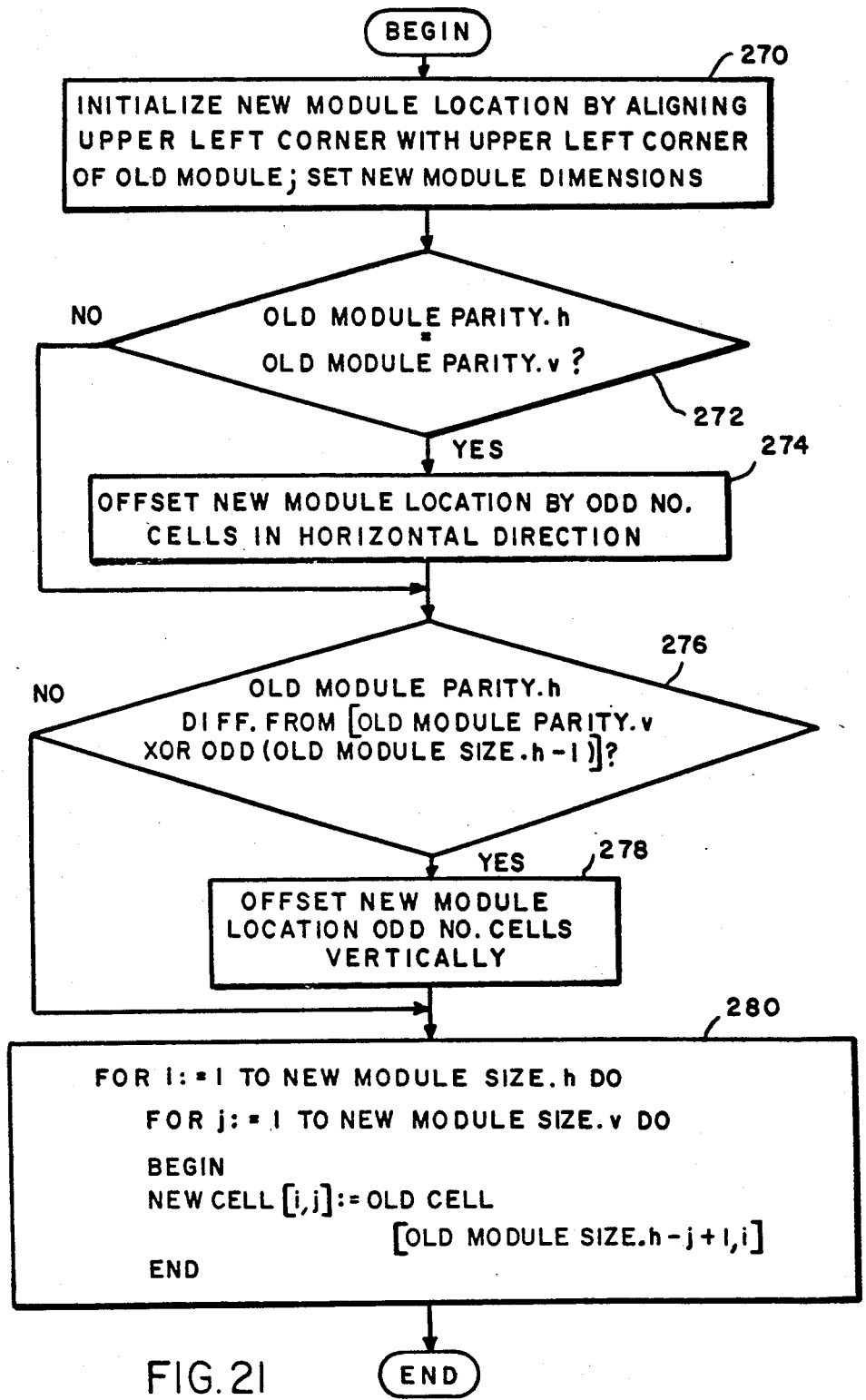
FIG. 21 is a flow chart for the procedure for rotating a module in the array counterclockwise by 90°.
Figure 22:
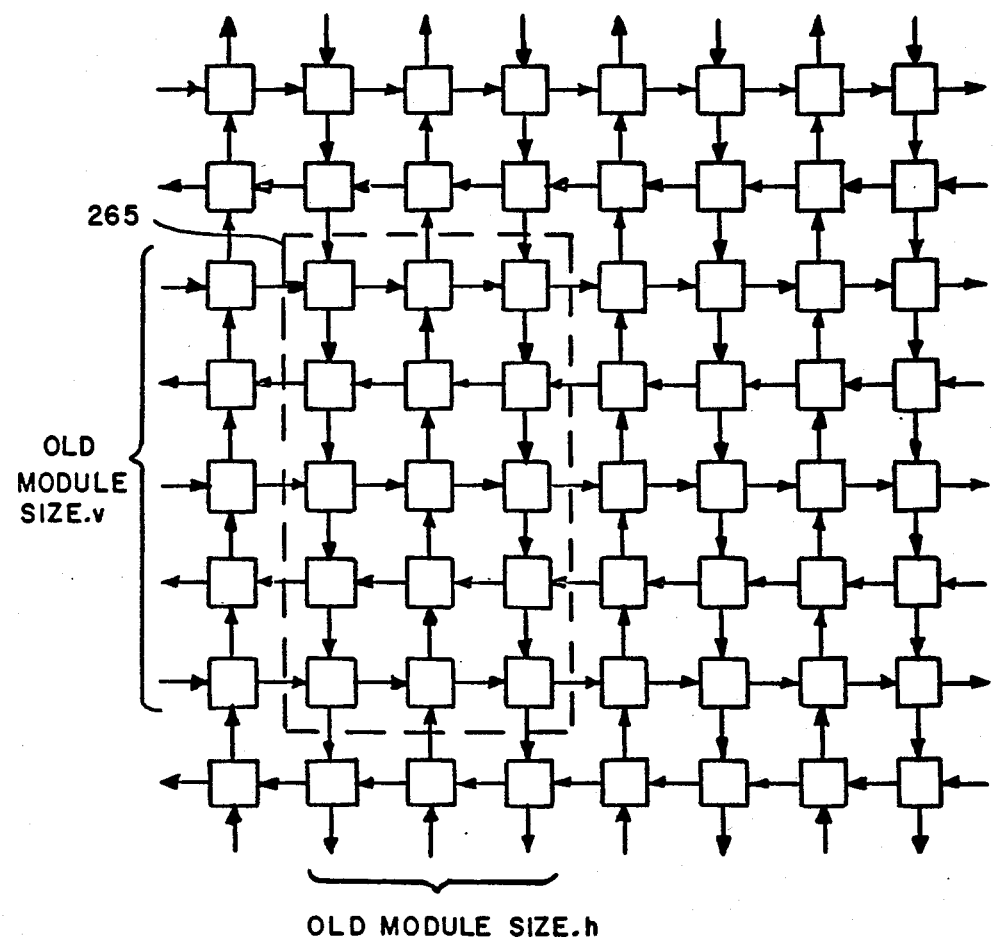
FIG. 22 is a diagrammatic illustration of a module in the array, which module is to be rotated by 90° counterclockwise.
Figure 23:
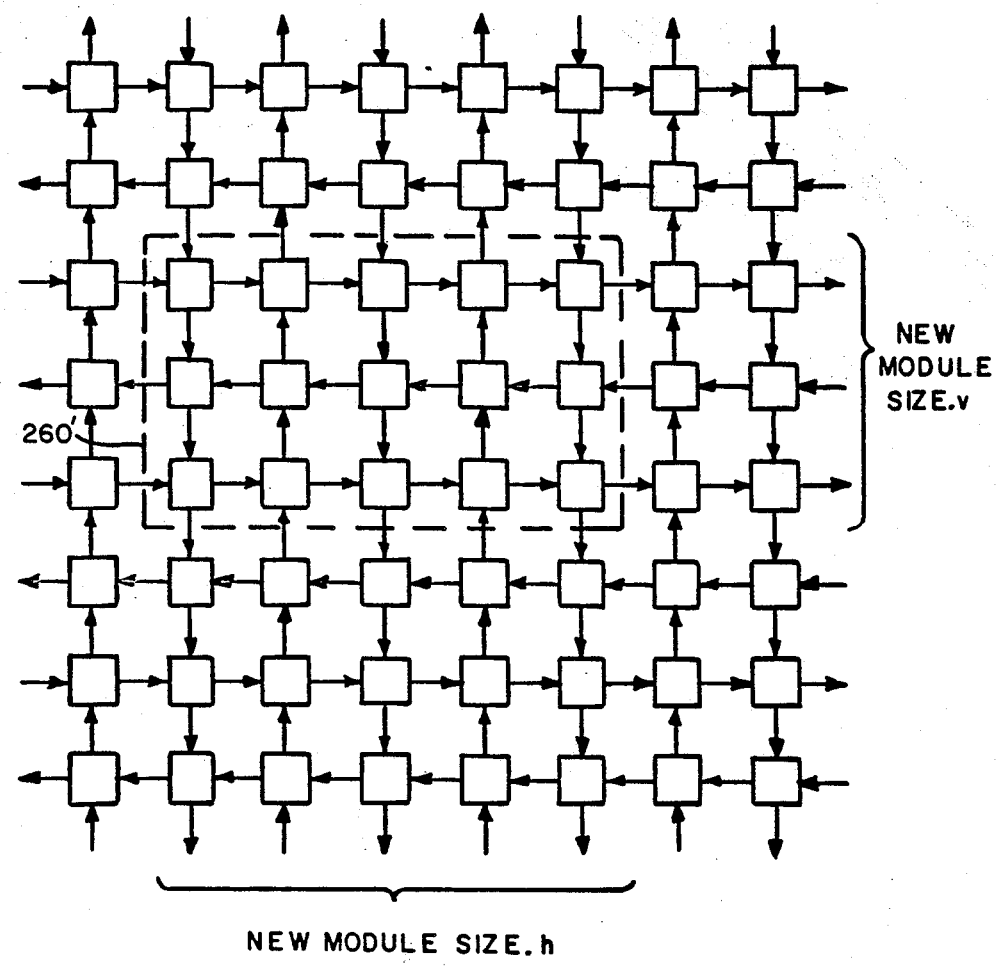
FIG. 23 is a diagrammatic illustration of the block of FIG. 22 in a tentative new position after rotation but prior to translation for parity adjustment.
Figure 24:
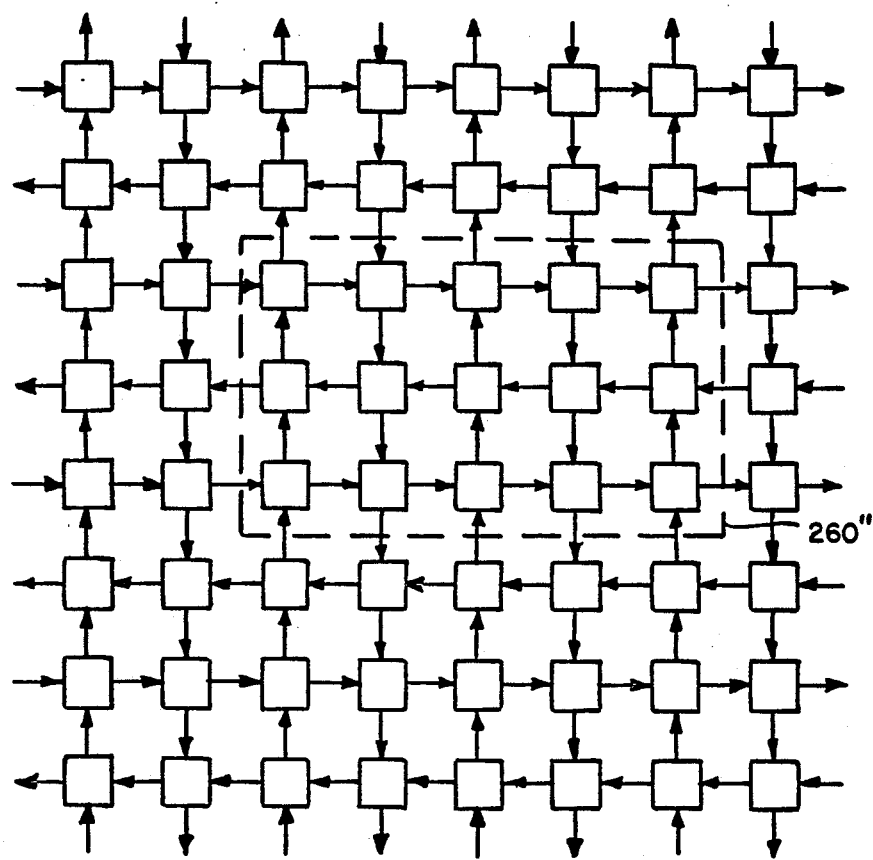
FIG. 24 is a diagrammatic illustration showing the module of FIG. 22 in its final position after rotation and adjustment for parity.

A flow chart for accomplishing module rotation is shown in FIG. 21. This flow chart should be read in relation to FIGS. 22–24. FIG. 22 shows a block within dashed line 260, prior to rotation. FIG. 23 shows the same block in its tentative new position 260' after rotation, prior to translation for parity adjustment. FIG. 24 shows the block at its final position 260" after rotation and translation.

The FIG. 21 procedure rotates a module by ninety degrees in the counterclockwise direction. First, the location and dimensions of the new module are initialized (Step 270). This involves aligning the cells at the upper left hand corners of the new module and the old module and setting the horizontal and vertical sizes of the new module equal to the vertical and horizontal sizes, respectively, of the old module. Next, the old module's horizontal parity is compared with the old module's vertical parity (Step 272). If the two parities are equal, the location of the new module is offset horizontally by an odd number of cells (Step 274). Following that step, or following Step 272 if the parities were unequal, a test is performed to determine whether a vertical offset is required to correct the horizontal parity of the new module (Step 276). This latter step more specifically involves comparing the horizontal parity of the old module with the vertical parity of the rightmost column of the old module. The rightmost column of the old module becomes the topmost row of the new module, so a comparison of their parities will determine if the rotation will, without compensation, produce the wrong horizontal parity in the new module. If so, the parity is corrected by offsetting the new module by an odd number of cells in the vertical direction, Step 278. The function [oldModuleParity.v XOR ODD(oldModuleSize.h-1)] in Step 276 evaluates the parity of the column at oldModuleSize.h-1, where oldModuleSize.h represents the horizontal size of the old module, in numbers of cells. The ODD function is TRUE when its argument is odd and FALSE when its argument is even. Performing the exclusive-OR operation (i.e., shown as XOR in the drawing) on the vertical parity of the old module and the function ODD(oldModuleSize.h-1) yields the parity of the rightmost column of the old module, which controls whether a vertical offset is required in order to ensure that the new module will have the proper horizontal parity.

Once the new module is properly positioned so as to have the desired parity, each cell in the old module's array must be moved to the proper location in the new module's array. That is the function of Step 280.

In the latter step, a Pascal-type expression is given for a procedure which accomplishes that operation. This procedure comprises a pair of nested loops. The outer loop is indexed by the variable "i", which denotes the horizontal coordinate of a cell in the new, rotated module, relative to the module's origin (i.e., upper left hand corner). The horizontal size of the new module (i.e., after rotation), is represented by the variable newModuleSize.h. The inner loop is indexed by the variable "j", which denotes the vertical coordinate of a cell in the new module, relative to the module's origin. The quantity "newCell[i,j]" represents the state, or function, of the cell at coordinates (i,j) in the new module; the quantity "oldCell[oldmoduleSize.h-j+1,i]" represents the state of the cell in the original, "old" module at the indicated coordinates.

The flow charts of FIGS. 17, 19 and 21 present only the overall procedures used for reorienting modules. In addition, various ministerial details must be carried out in connection with the implementation of these procedures; for clarity of explanation, these low-level details have not been expressly discussed, as they will be readily apparent to a skilled programmer.

In addition to implementing procedures for rotating modules and reflecting modules about horizontal and vertical axes, a graphics-based programming environment for the array is capable of allowing modules to be "dragged" across a display screen (i.e., relocated on the medium by translation of location) in the horizontal and vertical directions. As this operation involves only a simple translation of cell coordinates, its implementation will be straightforward and requires no further explanation.

The advantages of the invention are attributable primarily to the properties of the herein-described cells, and then to the arrays which may be formed of those cells. The individual cells may be both rotated in 90° increments by selection of appropriate states, as well as reflected about horizontal and vertical axes. The cells also have the property that when pairs of cell inputs are interchanged and corresponding pairs of cell outputs are interchanged, starting from a cell in a particular state, the result is a cell in another valid, available state.

Having thus described two exemplary embodiments of the invention, it will be apparent that other embodiments also may be created. It will further be apparent that various alterations, modifications and improvements will readily occur to those skilled in the art. For example, other circuits may be used for the cells and the cells may be assigned other combinations of states. Additionally, cells may be operatively connected to each other through intermediate elements, such as switching elements (which may also provide cross-overs, ninety-degree bends and other Wiring functions), in addition to being directly connected. Such obvious alterations, modifications and improvements, though not expressly described herein, are nevertheles intended to be suggested by this disclosure and are within the true spirit and scope of the invention. Accordingly, the foregoing discussion is intended to be exemplary only, and not limiting. The invention is limited only as set forth in the following claims and equivalents thereto.

What is claimed is:

1. A digital logic cell for use in a programmable logic device, such cell having:
   a. first and second signal inputs for receiving input signals and first and second signal outputs for supplying output signals;
   b. means responsive to programming signals applied thereto for programming the cell to assume one of a plurality of available states, each state uniquely defining the type of signal supplied to the signal outputs, and each of the available cell states having the property that, when the cell is programmed in that state, if the first and second signal inputs of the cell are interchanged, and concurrently the first and second signal outputs of the cell are interchanged, then the resulting state of the cell is one of the available cell states; and
   c. the means for programming the cell providing a state wherein at least one of the signal outputs supplies an output signal comprising a logical function of the input signals received by both the first and second signal inputs.

2. A digital device containing an array of programmable logic cells, comprising:
   a. a plurality of programmable logic cells, each having (1) first and second signal inputs for receiving input signals and first and second signal outputs for supplying output signals and (2) means responsive to programming signals applied thereto for programming the cell to assume one of a plurality of available states, each state uniquely defining the type of signal supplied to the signal outputs;
   b. said plurality of cells being arranged operatively in a topology forming an array of rows and columns of cells such that each cell except those cells on the periphery of the array has four immediate neighbor cells, referred to as the cell's north, east, south and west neighbors; and
   c. said array containing at least one cell in each of four available orientations, wherein
      (i) in a first cell orientation, the first input of the cell is operatively connected to an output of the cell's western neighbor, the second input is operatively connected to an output of the cell's northern neighbor, the first output is operatively connected to an input of the cell's eastern neighbor, and the second output is operatively connected to an input of the cell's southern neighbor;
      (ii) in a second cell orientation, the first input of the cell is operatively connected to an output of the cell's northern neighbor, the second input is operatively connected to an output of the cell's eastern neighbor, the first output is operatively connected to an input of the cell's southern neighbor, and the second output is operatively connected to an input of the cell's western neighbor;
      (iii) in a third cell orientation, the first input of the cell is operatively connected to an output of the cell's eastern neighbor, the second input is operatively connected to an output of the cell's southern neighbor, the first output is operatively connected to an input of the cell's western neighbor, and the second output is operatively connected to an input of the cell's northern neighbor; and
      (iv) in a fourth cell orientation, the first input of the cell is operatively connected to an output of the cell's southern neighbor, the second input is operatively connected to an output of the cell's western neighbor, the first output is operatively connected to an input of the cell's northern neighbor, and the second output is operatively connected to an input of the cell's eastern neighbor.

3. The device of claim 2 wherein all of said plurality of programmable logic cells are functionally identical.

4. The device of either of claims 2 and 3 wherein each of said cells, other than those cells on the periphery of the array, is in one of said four orientations.

5. The device of claim 4 wherein each of said cells, other than those cells on the periphery of the array, is in a different orientation from its immediate neighbors.

6. The device of either of claims 2 and 3 wherein the array possesses certain attributes of symmetry such that an original circuit formed in the array, by programming an appropriate set of cell states, can be rotated 90° in the array, by an appropriate reprogramming of cell states of the array, to form a circuit that is functionally and topologically identical to said original circuit.

7. The device of either of claims 2 and 3 wherein the array possesses certain attributes of symmetry such that an original circuit formed in the array, by programming an appropriate set of cell states, can be reflected about an axis in the array, by an appropriate reprogramming of cell states of the array, to form a circuit that is functionally and topologically identical to said original circuit.

8. The device of either of claims 2 and 3 wherein the array possesses certain attributes of symmetry such that an original circuit formed in the array, by programming an appropriate set of cell states, can be both reflected about an axis in the array and rotated by 90°, by an appropriate reprogramming of cell states of the array, to form a circuit that is functionally and topologically identical to said original circuit.

9. The device of either of claims 2 and 3 wherein the available cell states for each cell have the property that for each available cell state, if the first and second cell inputs are interchanged and the first and second cell outputs are interchanged, then the resulting cell state is one of the available cell states.

10. A digital device containing an array of programmable logic cells, comprising:
  a. a plurality of functionally identical, programmable logic cells, each having a plurality of signal inputs and a plurality of signal outputs and being programmable to assume one of a plurality of available states;
  b. said plurality of cells being arranged operatively in a topology forming an array of rows and columns of cells such that each cell except those cells on the periphery of the array has four immediate neighbor cells;
  c. each of said cells being disposed in one of a plurality of distinct possible cell orientations, the orientations being related such that any cell orientation can be obtained from any other cell orientation through one of a reflection, a rotation, and a rotation followed by a reflection; and
  d. said array containing at least one cell in each of said cell orientations.

11. The device of claim 10 wherein each of said cells is in a different orientation than its immediate neighbor cells.

12. The device of either of claims 10 and 11 wherein each of said cells, other than those cells on the periphery of the array, is in one of said four orientations.

13. The device of either of claims 10 and 11 wherein each of said cells has only two inputs and only two output.

14. The device of any of claim 1, 2, 3, 10 or 11 wherein each of the available cell states possesses exactly one axis of symmetry.

15. The cell of any of claims 1, 2, 3, or 10 further including means for providing at least one state in which the cell provides at one of its outputs a logical constant value.

16. The device of any of claims 1, 2, 3 or 10 wherein the available cell states for each cell include a state in which one of the cell's first and second inputs is connected as one of a logical identity and a logical negation to one of its first and second outputs.

17. The cell of claim 16 wherein the available cell states include a state in which the other of the cell's first and second inputs is connected as one of a logical identity and a logical negation to the other of its first and second outputs.

18. The device of any of claims 1, 2, 3 or 10 wherein the available cell states for each cell include states providing functions from which a universal Boolean logic function may be assembled.

19. A digital logic cell for use in a programmable logic device, such cell having:
  a. only first and second signal inputs for receiving input signals and only first and second signal outputs for supplying output signals;
  b. means responsive to programming signals applied thereto for programming the cell to assume one of a plurality of available states, each state uniquely defining the type of signal supplied to the signal outputs, and each of the available cell states having the property that, when the cell is programmed in that state, if the first and second signal inputs of the cell are interchanged, and concurrently the first and second signal outputs of the cell are interchanged, then the resulting state of the cell is one of the available cell states; and
  c. the means for programming the cell providing a state wherein at least one of the signal outputs supplies an output signal comprising a logical function of the input signals received by both the first and second signal inputs.

20. A digital device containing an array of programmable logic cells, comprising:
  a. a plurality of programmable logic cells, each having two signal inputs and two signal outputs and being programmable to assume one of a plurality of available states;
  b. said plurality of cells being arranged in an array wherein, except for those cells on the periphery of the array, each of a cell's signal inputs and each of a cell's signal outputs is operatively connected to a neighboring cell in the array; and
  c. said array possessing certain attributes of symmetry such that an original circuit formed in the array, by programming an appropriate set of cell states, can be rotated 90° in the array, by an appropriate reprogramming of cell states of the array, to form a circuit that is functionally and topologically identical to said original circuit.

21. A digital device containing an array of programmable logic cells, comprising:
  a. a plurality of programmable logic cells, each having two signal inputs and two signal outputs and being programmable to assume one of a plurality of available states;
  b. said plurality of cells being arranged in an array wherein, except for those cells on the periphery of the array, each of a cell's signal inputs and each of a cell's signal outputs is operatively connected to a neighboring cell in the array; and
  c. said array possessing certain attributes of symmetry such that an original circuit formed in the array, by programming an appropriate set of cell states, can be reflected about an axis in the array, by an appropriate reprogramming of cell states of the array, to form a circuit that is functionally and topologically identical to said original circuit.

22. A digital device containing an array of programmable logic cells, comprising:
  a. a plurality of programmable logic cells, each having two signal inputs and two signal outputs and being programmable to assume one of a plurality of available states;
  b. said plurality of cells being arranged in an array wherein, except for those cells on the periphery of the array, each of a cell's signal inputs and each of a cell's signal outputs is operatively connected to a neighboring cell in the array; and
  c. said array possessing certain attributes of symmetry such that an original circuit formed in the array, by programming an appropriate set of cell states, can be both reflected about an axis in the array and rotated by 90°, by an appropriate reprogramming of cell states of the array, to form a circuit that is functionally and topologically identical to said original circuit.

* * * * *